US008481434B2

(12) United States Patent
Miya et al.

(10) Patent No.: US 8,481,434 B2
(45) Date of Patent: Jul. 9, 2013

(54) METHOD OF MANUFACTURING A SEMICONDUCTOR DEVICE AND PROCESSING APPARATUS

(75) Inventors: Hironobu Miya, Toyama (JP); Eisuke Nishitani, Toyama (JP); Yuji Takebayashi, Toyama (JP); Masanori Sakai, Takaoka (JP); Hirohisa Yamazaki, Toyama (JP); Toshinori Shibata, Tokyo (JP); Minoru Inoue, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 12/216,596

(22) Filed: Jul. 8, 2008

(65) Prior Publication Data
US 2009/0130860 A1 May 21, 2009

(30) Foreign Application Priority Data
Nov. 16, 2007 (JP) .................. 2007-298552

(51) Int. Cl.
*H01L 21/31* (2006.01)
*H01L 21/469* (2006.01)

(52) U.S. Cl.
USPC ........... 438/778; 438/710; 438/714; 438/720; 438/722; 156/345.26; 156/345.29; 156/345.33; 156/345.43; 118/712; 118/715; 216/38; 216/58; 216/67; 216/76; 134/1; 134/1.1; 134/1.2; 134/22.1; 134/30; 252/79.1; 252/79.2; 252/79.3

(58) Field of Classification Search
None
See application file for complete search history.

(56) References Cited

U.S. PATENT DOCUMENTS 6,147,006 A 11/2000 Mouri et al.
6,659,111 B1 12/2003 Mouri et al.
(Continued)

FOREIGN PATENT DOCUMENTS

JP A-2000-265276 9/2000
JP A-2000-299289 10/2000
(Continued)

OTHER PUBLICATIONS

Kitagawa et al., "Etching of High-k Dielectric $HfO_2$ Films in $BCl_3$-Containing Plasmas Enhanced with $O_2$ Addition," Japanese Journal of Applied Physics, vol. 45, No. 10, 2006, pp. L297-L300.
(Continued)

*Primary Examiner* — Julio J Maldonado
*Assistant Examiner* — Shantanu C Pathak
(74) *Attorney, Agent, or Firm* — Oliff & Berridge, PLC

(57) ABSTRACT

To remove the deposit including a high dielectric constant film deposited on an inside of a processing chamber, by using a cleaning gas activated only by heat. The method includes the steps of: loading a substrate or a plurality of substrates into the processing chamber; performing processing to deposit the high dielectric constant film on the substrate by supplying processing gas into the processing chamber; unloading the processed substrate from the inside of the processing chamber; and cleaning the inside of the processing chamber by supplying a halide gas and an oxygen based gas into the processing chamber, and removing the deposit including the high dielectric constant film deposited on the inside of the processing chamber, and in the step of cleaning the inside of the processing chamber, the concentration of the oxygen based gas in the halide gas and the oxygen based gas is set to be less than 7%.

15 Claims, 10 Drawing Sheets

U.S. PATENT DOCUMENTS

| | | |
|---|---|---|
| 7,357,138 B2 | 4/2008 | Ji et al. |
| 2003/0221779 A1* | 12/2003 | Okuda et al. ............. 156/345.26 |
| 2004/0011380 A1* | 1/2004 | Ji et al. ........................... 134/1.1 |
| 2004/0014327 A1* | 1/2004 | Ji et al. ........................... 438/722 |
| 2004/0129671 A1* | 7/2004 | Ji et al. ........................... 216/58 |
| 2008/0160777 A1* | 7/2008 | Ono et al. ..................... 438/710 |

FOREIGN PATENT DOCUMENTS

| | | |
|---|---|---|
| JP | A-2004-006620 | 1/2004 |
| JP | A-2004-146787 | 5/2004 |
| JP | A-2006-179834 | 7/2006 |
| JP | A-2006-339523 | 12/2006 |

OTHER PUBLICATIONS

Kitagawa et al., "Reactive Gases for Dry Etching of High-Dielectric-Constant Film Materials," Taiyo Nippon Sanso Technical Reports, No. 24, 2005, pp. 8-15.

Japanese Office Action issued Nov. 30, 2011 in Japanese Patent Application No. 2007-298552 (with translation).

* cited by examiner (REFERENCE: JAPANESE PATENT LAID OPEN NO. 2006-179834)

( REFERENCE; JAPANESE PATENT LAID OPEN NO. 2006-179834)

(REFERENCE: JAPANESE PATENT LAID OPEN NO. 2006-179834)

FIG. 11

| Bond | Bond strength (eV) | Bond | Bond strength (eV) |
|---|---|---|---|
| B-O | 8.38 | Hf-O | 8.30 |
| B-F | 7.85 | Hf-F | 6.73 |
| B-Cl | 5.3 | Hf-Cl | 5.16 |
| B-Br | 4.11 | | |
| | | Ni-O | 3.95 |
| C-O | 11.15 | Cr-O | 4.44 |
| C-F | 5.72 | Fe-O | 4.04 |
| C-Cl | 4.11 | | |
| C-Br | 2.9 | Ni-F | 4.45 |
| C-C | 6.29 | Cr-F | 4.61 |

METHOD OF MANUFACTURING A SEMICONDUCTOR DEVICE AND PROCESSING APPARATUS

BACKGROUND OF THE INVENTION

1. Field of the Invention

The present invention relates to a method of manufacturing a semiconductor device including a step of processing a substrate and to a processing apparatus.

2. Description of the Related Art

In the semiconductor device such as DRAM & CMOS Logics whose higher density is progressed, in order to suppress a gate leakage current in a thinned gate insulating film, or in order to increase a capacitance of a capacitor, a high dielectric constant film (high dielectric insulating film) has been used as an insulating film.

When a high dielectric film is deposited, it is so required that the film can be formed at a low temperature, a surface morphology of the formed film is uniform and flat, step coverage and/or via-filling performance are superior, and also it is so required that fewer impurities are mixed into the film. The high dielectric film is deposited by supplying processing gas into a processing chamber into which a substrate is loaded. However, when the high dielectric film is deposited, a deposit including the high dielectric film is deposited on an inner wall of the processing chamber or a member such as a substrate supporting tool in the processing chamber, thus involving a problem that the adhered deposit is peeled off from the inner wall, etc, of the processing chamber and is fallen on the processing substrate if the worst happens and included in the high dielectric film. Therefore, in order to suppress such an inclusion of the foreign matter, it is necessary to clean the inside of the processing chamber or the member in the processing chamber by removing the deposit by etching, before the film thickness composed of the deposit reaches a specific thickness.

A wet etching method in this case detaching a reaction tube constituting the processing chamber and dipping it in a cleaning liquid, and a dry etching method in this case supplying excited etching gas into the processing chamber, are known as a method of etching the deposit. In recent years, the dry etching method, which does not require detaching of the reaction tube, has become more popular. As the dry etching method, a method of activating fluorine (F) based gas or chlorine (Cl) based gas by plasma and using it as the etching gas, and a method of activating $O_2$ added $BCl_3$ gas by plasma and using it as the etching gas, are already disclosed. (for example, see non-patent documents 1 and 2, and patent documents 1 to 3). Such etching methods using plasma are frequently performed using a single wafer processing apparatus, in order to achieve uniformity of the plasma density distribution and easiness of control by the biasing voltage.

(Non-patent document 1) T. Kitagawa, K. Nakamura, K. Osari, K. Takahashi, K. Ono, M. Oosawa, S. Hasaka, M. Inoue: Jpn. J. Appl. Phys. 45 (10), L297-L300 (2006)

(Non-patent document 2) Tomohiro Kitagawa, Koichi Ono, Masanori Oosawa, Satoru Hasaka and Minoru Inoue: Taiyo Nippon Sanso Technical Reports NO 24 (2005)

(Patent document 1) Japanese Patent Application Laid-open No. 2006-179834

(Patent document 2) Japanese Patent Application Laid-open No. 2006-339523

(Patent document 3) Japanese Patent Application Laid-open No. 2004-146787)

SUMMARY OF THE INVENTION

However, in the dry etching method described above using plasma (hereinbelow referred to as plasma etching), it is necessary to provide a plasma generating source for activating the etching gas. For example, in the non-patent document 2 and the patent documents 1 to 3, 2.45 GHz microwave plasma is used for activating the etching gas. Thus, it can make a possible guess that an increase of a cost of the processing apparatus and consequently the manufacturing cost of the semiconductor device will be resulted in some cases.

On the other hand, etching methods by heating gas without using plasma (hereinbelow referred to as thermal etching) may also be considered. However, in such cases, it has been believed that it is difficult to achieve a high etching rate and the cleaning time is prolonged, thereby tending to lower the productivity.

An object of the present invention is to provide a manufacturing method of a semiconductor device and a processing apparatus, capable of removing a deposit including a high dielectric constant film deposited on a processing chamber, by using heating gas as an etchant.

According to one aspect of the present invention, there is provided a method of manufacturing a semiconductor device comprising the steps of: loading a substrate into a processing chamber; supplying a processing gas into the processing chamber and depositing a high dielectric constant film on the substrate; unloading the processed substrate from the inside of the processing chamber; and cleaning the inside of the processing chamber by supplying halide gas and oxygen based gas into the processing chamber, then removing the deposit including the high dielectric constant film deposited on the inside of the processing chamber wherein, in the step of cleaning the processing chamber, the concentration of the oxygen based gas in the halide gas and the oxygen based gas is set to be less than 7%.

According to another aspect of the present invention, there is provided a processing apparatus, including: a processing chamber that performs processing of depositing a high dielectric constant film on a substrate; a gas supply system that supplies processing gas into the processing chamber, for depositing the high dielectric constant film; a supply system that cleans the inside of the processing chamber by supplying halide gas and oxygen-based gas into the processing chamber, and removing the deposits including the high dielectric constant film deposited on the inside of the processing chamber; and a controller that controls the cleaning gas supply system, so that a concentration of the oxygen-based gas in the halide gas and the oxygen-based gas is set to be less than 7%.

According to the manufacturing method of the semiconductor device and the processing apparatus of the present invention, deposits including the high dielectric constant film deposited on the processing chamber can be removed at a high speed, using heating gas as an etchant.

BRIEF DESCRIPTION OF THE DRAWINGS

FIG. 3 are graphs showing the experimental result regarding oxygen concentration dependency of the etching rate, wherein

FIG. 4 are graphs showing the experimental results regarding temperature dependency of the etching rate in thermal etching, wherein

FIG. 5 is a graph showing the experimental result regarding chamber pressure and dependency of the etching rate, wherein

FIG. 11 is a table of bonding energy of various bonding species.

DESCRIPTION OF THE PREFERRED EMBODIMENTS

As described above, in some cases, a high etching rate is difficult to achieve with thermal etching. Inventors of the present invention make strenuous efforts in studying on a method of increasing the etching rate in thermal etching. As a result, based on the knowledge, the inventors of the present invention achieves a technique that the etching rate in thermal etching can be increased, by setting etching conditions such as oxygen-based gas concentration in the etching gas, temperature of the inside of the processing chamber (in a precise sense, temperature of a surface to be etched), and pressure in the processing chamber, in a prescribed range.

Thus, based on this knowledge, inventors of the present invention achieve the invention of a method of manufacturing a semiconductor device including the steps of: loading a substrate into a processing chamber; supplying processing gas into the processing chamber and depositing a high dielectric constant film on the substrate; unloading the processed substrate from the inside of the processing chamber; and supplying halide gas and oxygen-based gas into the processing chamber, then removing a deposit including the high dielectric constant film deposited on the inside of the processing chamber, and cleaning the inside of the processing chamber; wherein, in the step of cleaning the inside of the processing chamber, the concentration of the oxygen based gas in the halide gas and the oxygen based gas is less than 7%. It should be noted that "halide gas" means gas containing a halogen element, and "oxygen based gas" means gas containing oxygen atoms.

Also, based on this knowledge, it is possible to achieve the embodiment of the processing apparatus described in this invention, including: a processing chamber that performs processing of depositing a high dielectric constant film on a substrate; a processing gas supply system that supplies processing gas into the processing chamber, for depositing the high dielectric constant film; a cleaning gas supply system that supplies halide gas and oxygen-based gas into the processing chamber, for removing a deposit including the high dielectric constant film deposited on the inside of the processing chamber and cleaning the inside of the processing chamber; and a controller that controls the cleaning gas supply system, so that a concentration of the oxygen-based gas in the halide gas and the oxygen-based gas is less than 7%.

The knowledge obtained by the inventors is described in more detail below.

Figure 1A:
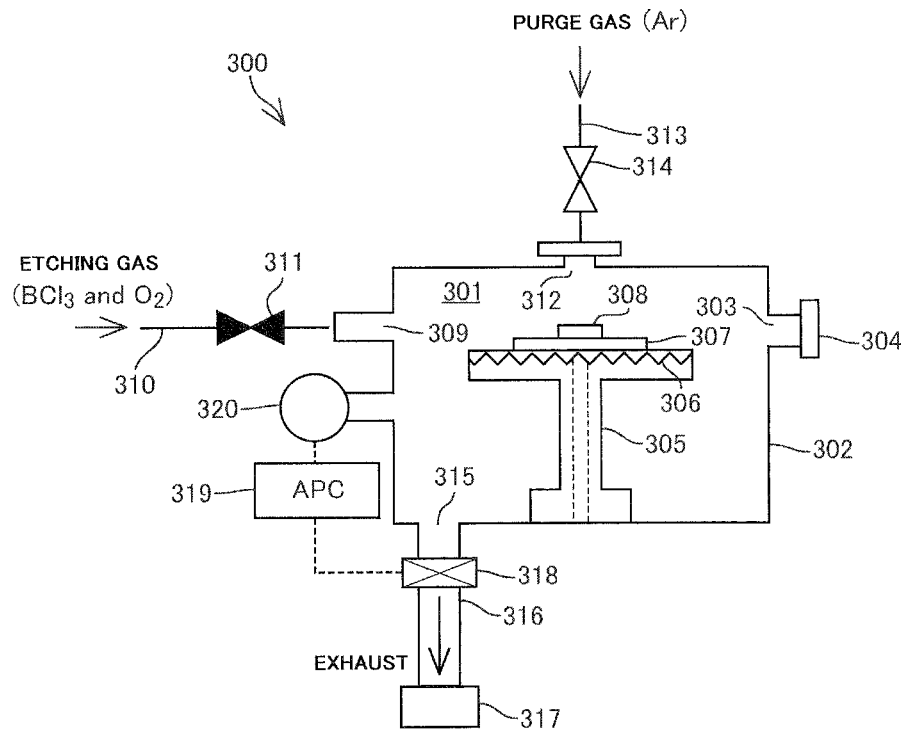
FIG. 1A is a schematic block diagram of a experiment apparatus used in an evaluation of thermal etching and FIG. 1B is a flow chart showing a method of evaluating the thermal etching.
Figure 1B:
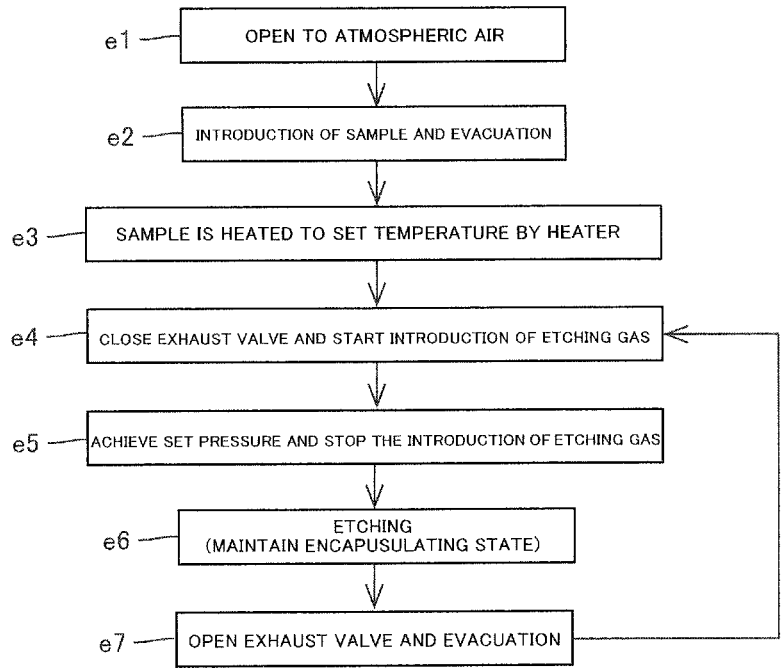

FIG. 1A shows the construction of an experimental apparatus 300 used in the evaluation of thermal etching by the inventors. Also, FIG. 1B shows the flow of thermal etching conducted by the inventors using the experimental apparatus 300. As shown in FIG. 1A, the experimental apparatus 300 comprises leak free vacuum container 302. A reaction chamber 301 in which thermal etching is performed is constituted within the vacuum container 302.

In the side face of the vacuum container 302, there is provided a loading port 303 as an opening for loading a test sample 308 into and from the reaction chamber 301. The sample 308 is constituted as a quartz glass substrate of 15 mm×15 mm with an $HfO_2$ film deposited by ALD method, for example, on its surface. Also, a gate valve 304 is provided at the loading port 303. The gate valve 304 is constructed so as to open/close the loading port 303.

A heating stage 305 that heats the sample 308 is provided at the reaction chamber 301. Specifically, a sample holder 307 is provided at the top of the heating stage 305; the sample 308 is set horizontally on the sample holder 307. A heater 306 that heats the sample 308 is incorporated within the heating stage 305 below the sample holder 307.

In the side face of the vacuum container 302 on the opposite side where the loading port 303 is provided, there is provided a gas supply port 309 that communicates with the inside of the reaction chamber 301. A gas supply pipe 310 that supplies etching gas containing $BCl_3$ and $O_2$ is connected to the gas supply port 309. A valve 311 is provided at the gas supply pipe 310, and supply of etching gas into the reaction chamber 301 can be started or stopped by opening/closing the valve 311. It should be noted that the oxygen concentration in the etching gas that is supplied from the gas supply pipe 310 i.e. the ratio of the amount of $O_2$ with respect to the total amount of $BCl_3$ and $O_2$ is adjustable arbitrarily.

A purge gas supply port 312 that communicates with the inside of the reaction chamber 301 is provided on an upper surface (ceiling wall) of the vacuum container 302. A purge gas supply pipe 313 that supplies inert gas such as Ar, for example, is connected to the purge gas supply port 312. A valve 314 is provided at the purge gas supply pipe 313, so that supply of the purge gas into the reaction chamber 301 can be started or stopped by opening/closing the valve 314.

An exhaust port 315 that communicates with the inside of the reaction chamber 301 is provided at the bottom face of the vacuum container 302. An exhaust pipe 316 is connected to the exhaust port 315. An exhaust valve 318 and vacuum pump 317 are provided in that order from the upstream side in the exhaust pipe 316. A pressure gauge 320 that measures the pressure in the reaction chamber 301 is provided on the side face of the vacuum container 302. The exhaust valve 318 and pressure gauge 320 are respectively connected to an APC (auto pressure controller) 319. The APC 319 controls the degree of opening of the exhaust valve 318 based on the pressure value measured by the pressure gauge 320 and adjusts the pressure in the reaction chamber 301 to a desired pressure.

Next, a method of evaluating the etching rate in thermal etching using the experimental apparatus 300 described above will be described with reference to FIG. 1B.

First, the inside of the reaction chamber 301 is opened to the atmosphere (e1) by opening the gate valve 304 with the valves 311, 314 and the exhaust valve 318 closed. The sample 308 is then loaded into the reaction chamber 301 through the loading port 303 and placed on the sample holder 307. The film thickness (hereafter defined as initial film thickness) of the $HfO_2$ deposited on the sample 308 is measured beforehand prior to loading. This measurement of film thickness can be performed by a technique such as ellipsometry, for example. The inventors employed a MARY 102 (light source wavelength 632.8 nm) manufactured by Five Lab Co., Ltd. for this measurement.

After introduction of the sample 308 into the reaction chamber 301, the gate valve 304 is closed, and the inside of the reaction chamber 301 is evacuated (e2) by operating a vacuum pump 317 and opening the exhaust valve 318. Then, by operating the heater 306, the surface of the sample 308 is heated to the set temperature, for example 350 to 450° C. (e3).

Next, by closing the exhaust valve 318 and opening the valve 311, etching gas including $BCl_3$ and $O_2$ is supplied (e4) into the reaction chamber 301 from the gas supply pipe 310. When the pressure in the reaction chamber 301 reaches the prescribed set value pressure, supply of etching gas into the reaction chamber 301 is stopped by closing the valve 311, thus filling the reaction chamber 301 with the etching gas (e5). The $HfO_2$ film that is deposited on the surface of the sample 308 is then etched (e6) by maintaining a state that the etching gas containing $BCl_3$ and $O_2$ is encapsulated in the reaction chamber 301 for a prescribed time. When a prescribed time is elapsed with the etching gas encapsulated therein, the exhaust valve 318 is opened and evacuation of the inside of the reaction chamber 301 is conducted (e7) by means of the vacuum pump 317.

Then, the aforementioned steps e4 to e7 are set as one cycle, and this cycle is repeated a prescribed number of times (so-called as cycle etching). Thereafter, the inside of the reaction chamber 301 is purged by introducing inert gas into the reaction chamber 301 by opening the valve 314; and thereafter the exhaust valve 318 is closed, with the purge gas introduced into the reaction chamber 301, and the inside of the reaction chamber 301 is returned to atmospheric pressure again. The gate valve 304 is then opened and the etched sample 308 is unloaded from within the reaction chamber 301, through the loading port 303, to outside the reaction chamber 301, and the film thickness (hereafter defined as final film thickness) of the etched $HfO_2$ film is measured.

In the above, the time duration from Step e4 to Step e5 (during supply of etching gas into the reaction chamber 301) is defined as the transient time and the time duration from Step e5 to completion of Step e6 (enclosing the etching gas in the reaction chamber 301) is defined as the encapsulating time. In other words, the transient time means the time in which the surface temperature of the sample 308 is kept constant, while the pressure within the reaction chamber 301 is still increasing; and the enclosing time means the time in which the surface temperature of the sample 308 and the pressure in the reaction chamber 301 are respectively kept constant.

When one cycle of the cycle etching is focused, the etching rate, i.e. the average etching rate from start of supply (e4) of etching gas into the reaction chamber 301 by opening the valve 311 to evacuation of the inside of the reaction chamber 301 by opening (e7) the exhaust valve 318, can be defined by the following formula (1):

Etching rate=(initial film thickness−final film thickness)/(transient time+encapsulating time) (1)

Since etching is chiefly conducted in the encapsulating time, the etching rate can be regarded as (initial film thickness−final film thickness)/encapsulating time, but, in this case, the etching rate is calculated irrespective of the fact that etching is performed even in the transient time, although an etching amount in this case is small, and the etching rate is therefore over-estimated. The inventors of the present invention consider it necessary to calculate the etching rates accurately in the transient time and in the encapsulating time, and obtain these etching rates as follows.

First, the etching rate in the transient time, namely, an average etching rate from starting the supply of the etching gas into the reaction chamber 301 by opening the valve 311 (e4), until the supply of the etching gas is stopped by closing the valve 311 (e5) is obtained by the following formula (2).

Etching rate in the transient time=(initial film thickness−film thickness after stoppage of gas supply)/transient time (2)

Also, the etching rate in the encapsulating time, namely, the average etching rate after encapsulating the etching gas in the reaction chamber 301 by closing the valve 311 (e5) until the inside of the reaction chamber 301 is evacuated by opening the exhaust valve 318 (e7), is obtained by the following formula (3), while using the aforementioned formula (2):

Etching rate in the enclosing time={initial film thickness−(etching rate during the transient time× transient time)−final film thickness}/encapsulating time (3)

It should be noted that, although the above formulas (1) to (3) are in each case the formulas focusing on one cycle, it is also possible to obtain the average etching rate throughout the entire cycle etching, in consideration of the total transient time (each transient time×number of cycles) throughout the entire cycle etching and the total encapsulating time (each encapsulating time×number of cycles).

An experimental result of the etching rate in thermal etching will be explained, while comparing it with the data of the plasma etching disclosed in the patent document 1.

(Evaluation of Encapsulating Time)

In the cycle etching, the total etching amount can be more precisely controlled based on the number of cycles if the amount of etching per cycle is determined. At this time, the etching rate in the encapsulating time must be large, and in addition, the etching rate must be stable every one cycle (fluctuation in etching amount every one cycle must be small) Also, in order to obtain conditions for optimizing the etching rate such as (oxygen concentration, temperature, and chamber pressure) accurately, the etching rate must be stable. Therefore, the inventors focus on a relation between the etching rate and the encapsulating time, and evaluate a correlation of them.

Figure 2:
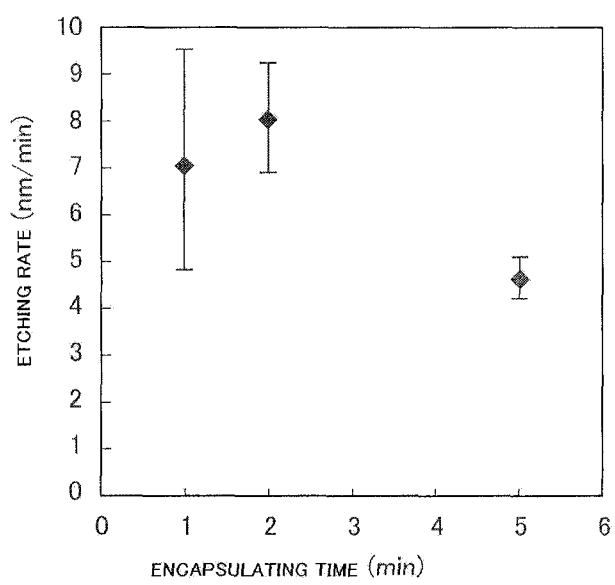
FIG. 2 is a graph showing the experimental results regarding encapsulating time dependency of the etching rate.

The results are shown in FIG. 2. The horizontal axis in FIG. 2 shows the encapsulating time and the vertical axis shows the etching rate in the encapsulating period. A gas containing $BCl_3$ and $O_2$ was used, the ratio of the amount of $O_2$ with respect to the total amount of $BCl_3$ and $O_2$ was set at 10%. The etching rate was calculated based on the above formula (3). Also, the pressure in the reaction chamber 301 during the enclosing time was set at 100 Torr and the surface temperature of the sample 308 was set at 400° C.

From FIG. 2, it is found that, although the etching rate when the encapsulating time set at 1 minute, is about 7 nm/min in average, which is relatively high, there is a larger variation, compared to the etching rate when the encapsulating time set at 2 minutes. Also, the etching rate when the encapsulating time set at 5 minutes, is less than 5 nm/min in average, and it is found that the etching rate is significantly lowered, compared to the etching rate when the encapsulating time set at 2 minutes. Specifically, although there is a possibility of a variation of the relationship between etching rate and enclosing time depending on conditions such as the volume of the reaction chamber 301, in the case of the experimental apparatus 300 described above, it was found that a high etching rate was obtained with a enclosing time of 2 minutes and that the etching rate per one cycle could be stabilized. In the evaluations described below, the inventors therefore perform cycle etching, with the encapsulating time set at 2 minutes. Note that the etching rate is lowered when the encapsulating time is set at 5 minutes, and one factor thereof is considered to be that the etching gas encapsulated in the reaction chamber 301 is consumed with a progress of the etching processing and the concentration of the etching gas is lowered.

(Evaluation of Oxygen Concentration Dependence)

Next, the experimental result of the oxygen concentration dependency of the etching rate will be described with reference to FIG. 3.

Figure 3A:
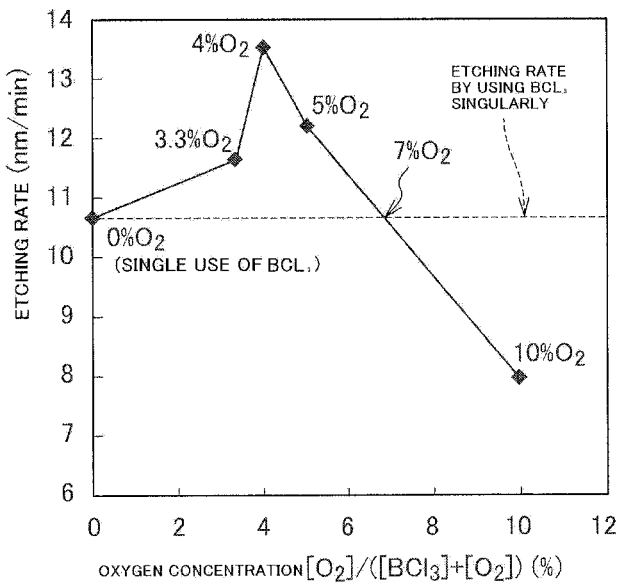
FIG. 3A shows the experimental results in thermal etching and FIG. 3B shows the experimental results in plasma etching.
Figure 3B:
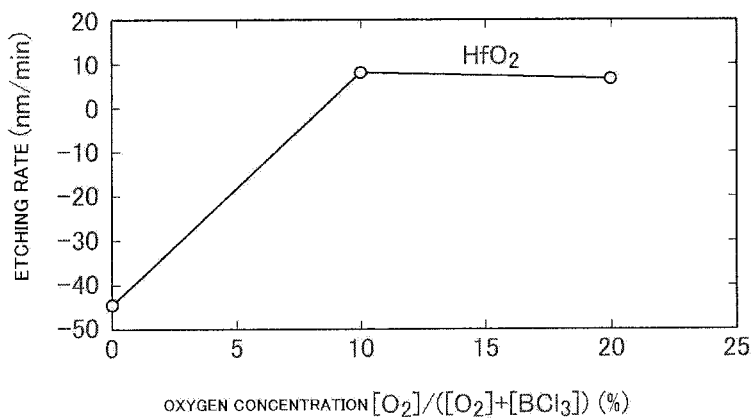

FIG. 3 is a graph showing the experimental result regarding oxygen concentration dependency of the etching rate, wherein FIG. 3A shows the experimental result in thermal etching and FIG. 3B shows the experimental result in plasma etching, respectively. In FIG. 3A and FIG. 3B, the horizontal axis shows the ratio of the amount of $O_2$ (oxygen concentration) with respect to the total amount of $BCl_3$ and $O_2$, and the vertical axis shows the etching rate. FIG. 3B shows reference data extracted from the aforementioned patent document 1.

In the evaluation shown in FIG. 3A, etching gas containing $BCl_3$ and $O_2$ was used, and by changing a ratio of an amount of $O_2$ to a total amount of $BCl_3$ and $O_2$ (oxygen concentration) from 0% to 10%, the etching rate in each oxygen concentration was calculated based on the aforementioned formula (1). In addition, the pressure in the reaction chamber 301 at an encapsulating period was set at 100 Torr, and a surface temperature of the sample 308 was set at 400° C.

From FIG. 3A, it is found that in the thermal etching, if the oxygen concentration is set at more than 0% but less than 7%, the etching rate exceeds 10.7 nm/min in case of using $BCl_3$ singularly, and when the oxygen concentration is set at 10%, the etching rate is 8 nm/min, which is significantly lower than the etching rate in case of using $BCl_3$ singularly. As described above, it is possible to obtain a knowledge by the inventors that preferably the oxygen concentration is set at 0% to 7%, and by setting the oxygen concentration within this range, the thermal etching is possible at the etching rate exceeding the etching rate in case of using $BCl_3$ singularly.

Also, from FIG. 3A, it is found that in the thermal etching, the etching rate rises steeply in a range of the oxygen concentration from 3.3% to 5%, and particularly when the oxygen concentration is 4%, the etching rate reaches maximum value of 13.6 nm/min. The etching rates for oxygen concentrations of 3.3% and 5% were 11.7 nm/min and 12.2 nm/min, respectively. As described above, the inventors of the present invention obtains a knowledge that preferably the oxygen concentration is set at 3.3% to 5%, and by setting the oxygen concentration within this range, the thermal etching with high etching rate is possible.

Also, when the oxygen concentration exceeds 4%, the etching rate drops steeply, the etching rate becomes equivalent to the etching rate in case of setting the oxygen concentration at 4% or less. As described above, the inventors of the present invention obtains a knowledge that preferably the oxygen concentration is set at 4% or less, and by setting the oxygen concentration within this range, thermal etching can be performed with further high etching rate while minimizing added amount of oxygen.

Note that when the oxygen concentration exceeds 4%, the etching rate drops steeply, and when the oxygen concentration exceeds 7%, the etching rate is lower than the etching rate in case of using $BCl_3$ singularly, and when the oxygen concentration is 10%, the etching rate is 8 nm/min. Although not shown, it was confirmed that, when the oxygen concentration is set to 15%, the etching rate drops below the etching rate (8 nm/min) when the $O_2$ concentration is 10%, and, furthermore, when the $O_2$ concentration is set to 20%, the etching rate drops further below the etching rate when the $O_2$ concentration is 15%. That is, it was found that, if the $O_2$ concentration exceeds 4%, at least in a range up to 20%, the etching rate shows a decreasing trend as the $O_2$ concentration increases.

It can be seen from FIG. 3B that, in the case of plasma etching, if the oxygen concentration is 0%, etching is not performed and a deposit is generated ✦ and when the oxygen concentration is 10% or 20%, the deposit is not generated and the etching is performed. Also, if the oxygen concentration is in the range of 10% or more, it is found that the etching rate is slightly reduced.

When FIG. 3A and FIG. 3B are compared, the deposit is not generated and the etching is performed, even in a case of the $O_2$ concentration in a range from 0% to 10% in the thermal etching compared to the plasma etching, furthermore, as described above, thermal etching displays advantageous features, which are not found in the case of plasma etching, such as that, when the $O_2$ concentration is 4%, the etching rate becomes specifically large. That is, it is found that the oxygen concentration dependence differs considerably between plasma etching and thermal etching. In the experiment of thermal etching described below, a condition of setting the oxygen concentration at 4%, in which the etching rate is most increased, is defined as a mixing condition of $BCl_3$ and $O_2$.

(Evaluation of Temperature Dependency)

Next, the experimental result of the temperature dependency of etching rate will be described with reference to FIG. 4.

Figure 4A:
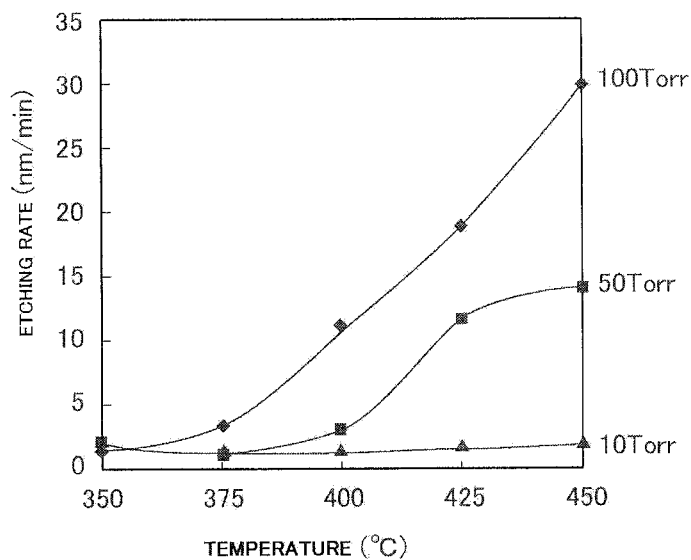
FIG. 4A shows the experimental results in the case of adding $O_2$ to $BCl_3$ and FIG. 4B shows the experimental results; of a case using $BCl_3$ singularly.
Figure 4B:
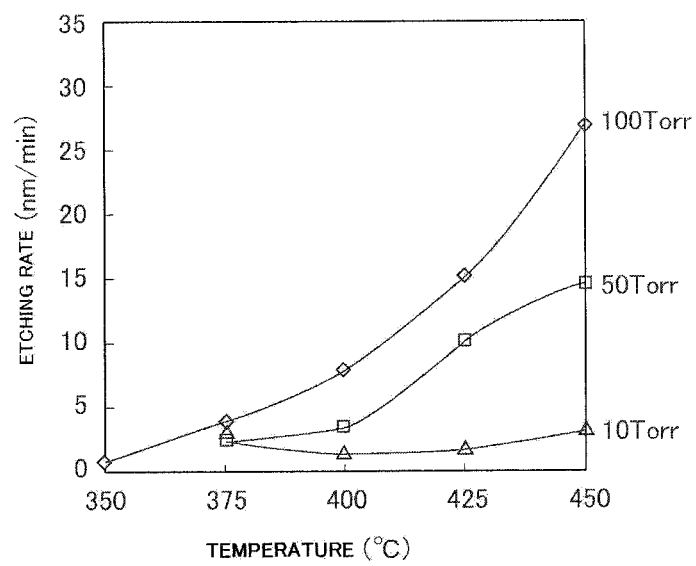

FIG. 4 is a graph showing the experimental result regarding the temperature dependency of the etching rate, wherein FIG. 4A shows the experimental result in the thermal etching, when $O_2$ is added to $BCl_3$, and FIG. 4B shows the experimental result in the thermal etching when $BCl_3$ is used singularly. In both FIG. 4A and FIG. 4B, the horizontal axis shows the surface temperature of the sample 308 and the vertical axis shows the etching rate in the encapsulating period.

Figure 10:
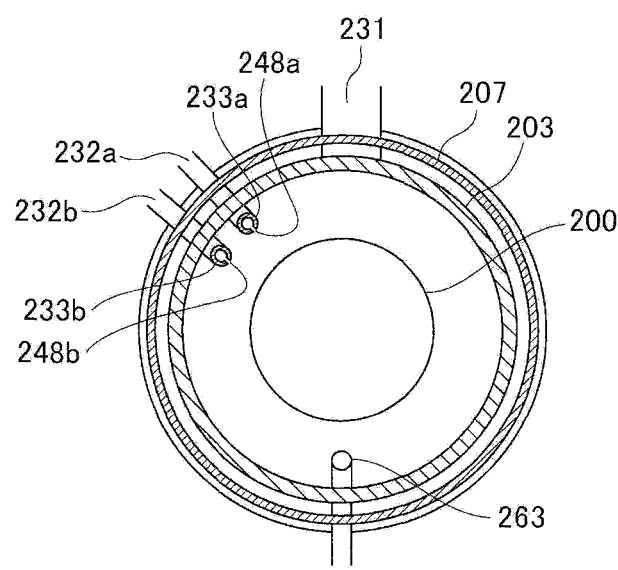
FIG. 10 is a cross-sectional view taken along the line A-A of the processing furnace shown in FIG. 9.

In the evaluations shown in FIG. 4A and FIG. 4B, the surface temperature of the sample 308 was changed in a range from 350 to 450° C. and the etching rate in each surface temperature and each pressure was measured, while changing the pressure in the reaction chamber 301 at encapsulating time so as to be 10 Torr, 50 Torr, and 100 Torr. The etching rate was calculated by the method illustrated in formula (3) described above. In FIG. 4A, 10 Torr is shown by ▲, 50 Torr is shown by |, and 100 Torr is shown by ♦, respectively. In the evaluation shown in FIG. 4A, etching gas containing $BCl_3$ and $O_2$ was used, and the ratio of the amount of $O_2$ (oxygen concentration) with respect to the total amount of $BCl_3$ and $O_2$ was set at 4%.

Also, in the evaluation shown in FIG. 4B, $BCl_3$ was used singularly (oxygen concentration of 0%). In FIG. 4B, 10 Torr is shown by Δ, 50 Torr is shown by □, and 100 Torr is shown by ◇, respectively.

It is found from FIG. 4A and FIG. 4B that the etching rate is increased on the higher-pressure side and the higher-temperature side in each case. Also, when FIG. 4A and FIG. 4B are compared, under the pressure of 10 Torr and 50 Torr, no great difference in the etching rate is seen between the case where $O_2$ is added and the case where $O_2$ is not added, at each temperature of 375° C., 400° C., 425° C. and 450° C. However, under the pressure of 100 Torr (13300 Pa), a considerable difference in the etching rate was confirmed between the case where $O_2$ was added and the case where $O_2$ was not added at each temperature of 400° C., 425° C., and 450° C. Namely, under the pressure of 100 Torr (13300 Pa), and at the temperature of 400° C. or more, it was confirmed that the etching rate in case of adding $O_2$ is significantly higher than the etching rate in case of not adding $O_2$. Specifically, in case of adding $O_2$ and the pressure set at 100 Torr, the etching rate was 13.6 nm/min at 400° C., 20 nm/min at 425° C., and 30 nm/min at 450° C. In other words, it was found that under the pressures of about 10 to 50 Torr, the effect of $O_2$ addition was not particularly great at any temperature, but under the pressures of 100 Torr (13300 Pa) and at the temperatures of 400° C. or more, the effect of $O_2$ addition was observed remarkably. This is also clear from FIG. 5A as will be described later. Thus, it is preferable to set the etching temperature at 400° C. or more, and set the etching pressure at 100 Torr or more.

Note that at the temperature exceeding 600° C., crystallization rate of a high dielectric constant film (for example, $HfO_2$ film) to be etched proceed greatly faster than the etching rate. Namely, at this temperature, the crystallinity of the high dielectric constant film to be etched changes abruptly, thus hardly allowing the etching reaction to occur, resulting in a steep drop of the etching rate. Therefore, it is preferable to set the etching temperature at 600° C. or less.

Also, although the etching rate rises as the pressure increases, if the etching rate excessively rises, it is difficult to achieve uniform etching in the reaction chamber 301. Consequently, preferably the etching pressure is set at 500 Torr (66500 Pa) or less and more preferably at 200 Torr (26600 Pa) or less.

By setting the surface temperature of the sample 308 and the pressure in the reaction chamber 301 within this range, the thermal etching can be performed at an etching rate exceeding the etching rate in case of using $BCl_3$ singularly. That is, even by performing thermal etching without using plasma, a fully satisfactory etching rate can be achieved that is in no way inferior to plasma etching, by raising the temperature of the surface to be etched to a prescribed temperature and by raising the pressure within the reaction chamber 301 to a prescribed pressure.

Evaluation of the Chamber Pressure Dependency)

Subsequently, the experimental result of the chamber pressure dependency of the etching rate will be explained, with reference to FIG. 5.

Figure 5A:
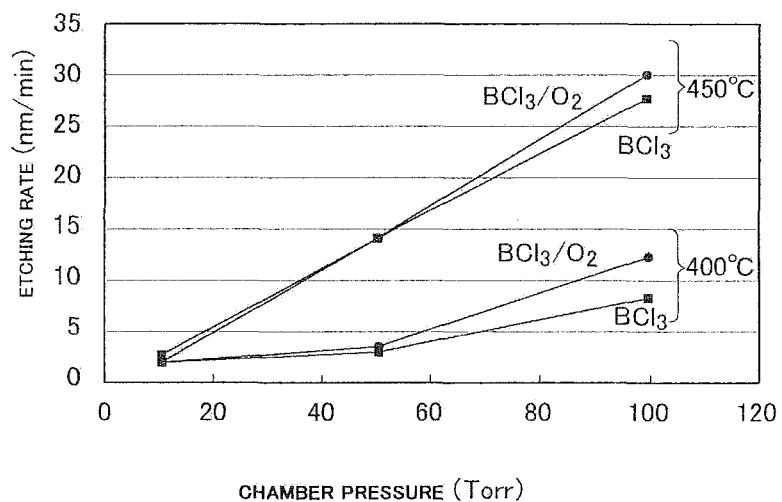
FIG. 5A shows the experimental result in thermal etching.
Figure 5B:
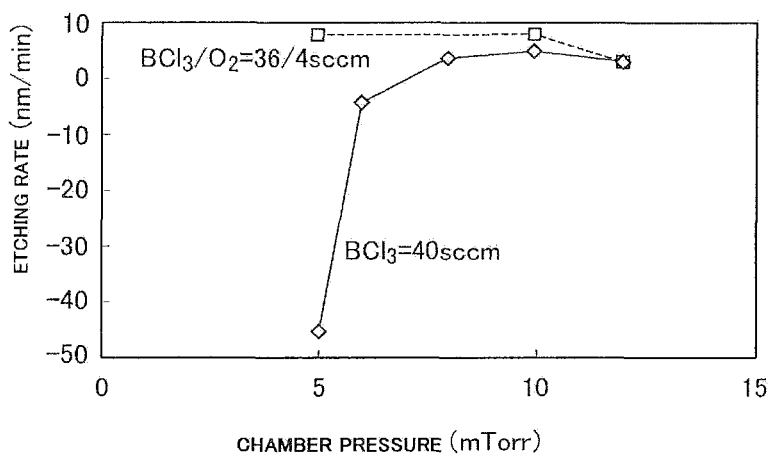
FIG. 5B shows the experimental result in plasma etching.

FIG. 5 is a graph showing the experimental result regarding the chamber pressure dependency of the etching rate in the thermal etching, wherein FIG. 5A shows the experimental results in the thermal etching and FIG. 5B shows the experimental results in the plasma etching, respectively. In both FIG. 5A and FIG. 5B, the horizontal axis shows the pressure in the reaction chamber 301 and the vertical axis shows the etching rate in the encapsulating period. FIG. 5B shows data extracted from the aforementioned document 1.

In FIG. 5A, while changing the pressure in the reaction chamber 301 at enclosing time from 10 to 100 Torr, and changing the surface temperature of the sample 308 from 400° C. to 450° C., the etching rate under each pressure and at each surface temperature was measured. The etching rate was calculated using the method indicated by the above formula (3). Also, the measurement of etching rate described above was respectively conducted for the case where etching gas containing $BCl_3$ and $O_2$ was used and the case where $BCl_3$ was used singularly. In this FIG. 5A, the case where gas containing $BCl_3$ and $O_2$ was used is shown by •, and the case where $BCl_3$ was used singularly is shown by |, respectively.

From FIG. 5A, it is found that, in the case of thermal etching, the etching rate increases as the pressure increases at any temperature. Also, it is found that, at any temperature, the etching rate in case of using the etching gas containing $BCl_3$ and $O_2$, is larger than the etching rate in case of using $BCl_3$ singularly. Particularly, the difference in etching rate between both cases becomes large, on the higher pressure side of 100 Torr or more.

The data shown in FIG. 5B were extracted from the patent document 1. It appears that, in the case of plasma etching when $BCl_3$ is used singularly, as shown by solid line, deposition is observed at a low pressures such as 5 mTorr and 6 mTorr, and when the pressure is set at 8 mTorr or more, although etching is observed, the etching rate is gradually saturated and, at the pressure of 10 mTorr or more, the etching rate tends to gradually decrease. Also, it appears that, if a gas containing $BCl_3$ and $O_2$ is used, a comparatively high etching rate is obtained even the pressure is low, as shown by the broken line ✦, and the following tendency is observed. Namely, the etching rate is not changed even if the pressure is increased and the etching rate is gradually lowered when the pressure reaches 10 mTorr or more. Also, it is found that, under the pressure of 10 mTorr or less, the etching rate is larger than the etching rate in case of using $BCl_3$ singularly. As described above, it is found that the chamber pressure dependency is largely different, between the thermal etching and the plasma etching, and the thermal etching has characteristics not found in the plasma etching.

(Evaluation of Temperature Dependence of the Selectivity)

Next, the evaluation results regarding the temperature dependency of the selectivity will be described with reference to FIG. 6.

In some cases, actually the deposit containing $HfO_2$ is not uniformly deposited on the inside of the reaction tube constituting the processing chamber of the processing apparatus, being a cleaning object. For example, in some cases, the film thickness of the deposit is locally thin or locally thick. Also, the surface temperature of an inner wall of the reaction tube is non-uniform or the pressure of the cleaning gas in the processing chamber is non-uniform, thus differentiating the etching rate of the deposit in some cases. In this case, when all the deposits deposited on the inside of the reaction tube are removed by etching, a part of the surface of the inner wall of the reaction tube composed of quartz glass ($SiO_2$), etc, is exposed to the cleaning gas for a long period of time, and is thereby damaged at some cases. In order to reduce such damage, it is effective to increase the selectivity of the quartz glass constituting the reaction tube and the $HfO_2$ film (namely, the ratio of the etching rate of the quartz glass to the etching rate of the $HfO_2$ film). The inventors of the present invention obtains a knowledge that by setting the temperature of the surface to be etched within a prescribed range, the selectivity can be increased, and evaluates the correlation between the temperature and the selectivity.

Figure 6A:
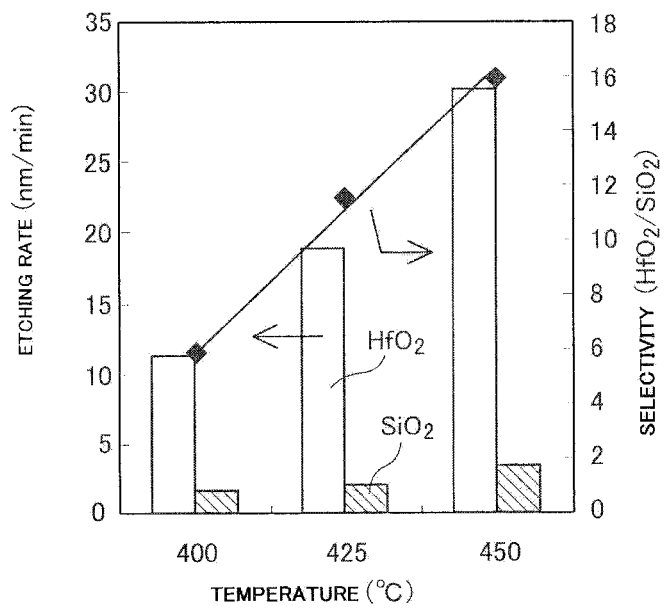
FIG. 6A is a graph showing the experimental results regarding the temperature dependence of etching rates and ratio of etching rates (hereafter defined as selectivity) in thermal etching and FIG. 6B is a graph showing the experimental results regarding the chamber pressure dependence of etching rates in plasma etching.
Figure 6B:
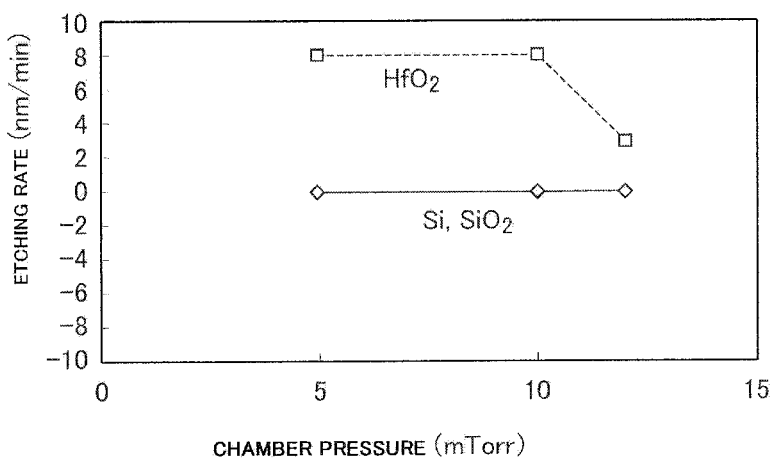

FIG. 6A is a graph showing the experimental results regarding the temperature dependency of the selectivity in the thermal etching and FIG. 6B is a graph showing the experimental results regarding the chamber pressure dependency of the selectivity in the plasma etching. In FIG. 6A, the surface temperature of the sample 308 is taken on the horizontal axis, and the etching rate is taken on the vertical axis of the left side, and the selectivity is taken on the vertical axis of the right side. Also, in FIG. 6B, chamber pressure is taken on the horizontal axis, and the etching rate is taken on the vertical axis. FIG. 6B is data extracted from the aforementioned patent document 1.

In the evaluation shown in FIG. 6A, TEOS-$SiO_2$ film was used instead of the quartz glass on a part of the surface of the sample 308. That is, the HfO$_2$ film and the TEOS-SiO$_2$ film were exposed respectively on the surface of the sample 308, and these films are exposed to etching gas under the same condition. Etching gas containing BCl$_3$ and O$_2$ was used, and the ratio of the amount of O$_2$ with respect to the total amount of BCl$_3$ and O$_2$ (i.e. the oxygen concentration) was set at 4%. Also, the pressure in the reaction chamber 301 in the encapsulating period was set at 100 Torr. The etching rate of the HfO$_2$ film and the etching rate of the TEOS-SiO$_2$ film were then measured for each case of setting the surface temperature of the sample 308 at 400° C., 425° C., and 450° C. and the selectivity (etching rate of the HfO$_2$ film/etching rate of the TEOS-SiO$_2$ film) was calculated. The etching rates were calculated by the method indicated in formula (3) given above. In FIG. 6A, the measured etching rates are shown in the form of a bar graph, and the values of selectivity calculated from the etching rates are shown by ♦.

It is found from FIG. 6A that the etching rates of the TEOS-SiO$_2$ film are almost constant, while the etching rate of the HfO$_2$ film is increased by increasing the surface temperature of the sample 308. In other words, it is found that as the temperature of the sample 308 is set higher, higher selectivity can be obtained. Also, it is found that if the surface temperature of the sample 308 is set at 450° C., the selectivity reaches 16 and this high selectivity can be obtained.

Note that when actually an etching was performed for the quartz glass, the damage of the quartz glass was not confirmed. Namely, when a quartz glass sample, with the HfO$_2$ film formed thereon, was prepared, and the HfO$_2$ film on the quartz glass substrate was completely subjected to etching, then the quartz glass substrate was subjected to over-etching for the same time period, and no damage was confirmed on the quartz glass substrate. Hereupon, the same condition as the condition for the evaluation of FIG. 6A is used.

As described above, the inventors of the present invention obtains a knowledge that under the condition for the evaluation of FIG. 6A, the selectivity (the ratio of etching rates of the HfO$_2$ film and the TEOS-SiO$_2$ film) can be sufficiently secured, and no damage is given to the quartz glass substrate even after completely removing the HfO$_2$ film, and concludes the damage to the quartz glass constituting the reaction tube can be suppressed.

The data shown in FIG. 6B were extracted from the patent document 1. Such data is obtained by measuring the etching rate of the HfO$_2$ film and the etching rates of Si and SiO$_2$ in plasma etching, with the pressure in the processing chamber changed. In the evaluation shown in FIG. 6B, the temperature of the surface to be etched is a room temperature. From FIG. 6B, it is found that, under any pressure, etching of Si and SiO$_2$ is not observed, and etching occurs in the HfO$_2$ film, thus realizing the etching with high selectivity, far beyond 1.

(3) Discussion

From the above experimental results, it was found that, by keeping the oxygen concentration in a prescribed range and by increasing the temperature of the surface of the sample 308 (etched surface), and by raising the pressure in the reaction chamber 301, it is possible to increase the etching rate in thermal etching. For example, as shown in FIG. 4A, it was found that an etching rate of 30 nm/min could be obtained when the mixing ratio (oxygen concentration) of the amount of O$_2$ to the total amount of BCl$_3$ and O$_2$ was set at 4%, the surface temperature of the sample 308 was set at 450° C., and the pressure in the reaction chamber 301 was set at 100 Torr. Such an etching rate is large even in comparison with the etching rate of 10 nm/min of plasma etching disclosed in patent document 1 shown in FIG. 3B, and is sufficiently applicable to cleaning the inside of the processing chamber of an actual wafer processing apparatus. Meanwhile, as disclosed in patent document 1, in the case of the plasma etching, a high etching rate is obtained by setting the oxygen concentration at 10% or more by using the etching gas containing BCl$_3$ and O$_2$, setting the surface to be etched at a low temperature (room temperature), and setting the pressure in the processing chamber at a low pressure.

Based on the above experimental results, the inventors conducted the following examination on the differences of the mechanism between thermal etching and plasma etching.

(Regarding Oxygen Concentration)

In case of etching HfO$_2$ as a deposit, it is necessary to allow a process of severing Hf—O bond, producing a reaction product of high vapor pressure, and removing off such a reaction product to the ambient. In order to allow this process to proceed, first of all, in order to sever the Hf—O bond, it is necessary to generate a new bond having a bonding force that is larger than that of the Hf—O bond.

FIG. 11 shows a list of various kinds of bonding energies (source: Lide, D. R. ed. CRC Handbook of Chemistry and Physics, 79th ed., Boca Raton, Fla., CRC Press, 1998). According to FIG. 11, since the bonding energy of Hf—O is 8.30 eV, which is large, it can be said that HfO$_2$ is a material that can be hardly removed by etching. Meanwhile, when a gas containing BCl$_3$ is used as the cleaning gas, B—O bond are formed by a withdrawing reaction of O by B; the bonding energy of the B—O bond is 8.38 eV, which is larger than the bonding energy of Hf—O, therefore the Hf—O bond can be severed and the aforementioned process can be allowed to proceed.

When cleaning gas containing BCl$_3$ heated or excited by plasma is supplied into a processing chamber in which HfO$_2$ has been deposited, Cl is released from the BCl$_3$ as shown by the formula (4) below. Then, O is withdrawn from the Hf—O bond constituting HfO$_2$ to form B—O bond, and also HfCl$_4$, BOCl, and (BOCl)$_3$ having high volatile properties are produced, and by volatilizing (isolating) such a reaction product, the etching reaction is allowed to proceed.

$$HfO_2 + 2BCl_3 \rightarrow HfO_2 + 2BCl + 4Cl \rightarrow HfCl_4 + 2(BOCl) \quad (4)$$

It should be noted that, in some cases, the etching reaction is restrained by formation of a protective film of B$_x$Cl$_y$ on the surface of the HfO$_2$ during the progress of the etching reaction described above. In such cases, in the case of thermal etching, as shown in FIG. 3A, progress of the etching reaction can be accelerated by mixing a small amount of an oxygen based gas, for example O$_2$, with the BCl$_3$ that is supplied to the HfO$_2$ film. This is because, as shown in the following formula (5), BOCl or (BOCl)$_3$ having high volatile property is generated by the reaction of BCl$_3$ and O$_2$, weakens an surface reaction suppressing effect of BClx, namely, suppresses formation of a BxCly protective film, and enhances an reaction of BCl or Cl on HfO$_2$, thus increasing the etching rate.

$$2BCl_3 + O \rightarrow BOCl + BCl + 4Cl \quad (5)$$

However, when O$_2$ is excessively mixed in BCl$_3$, as shown in FIG. 3A, progress of the etching reaction is suppressed. This is because by excessively mixing O$_2$, solid species such as B$_2$O$_3$ is generated without generating BCl or Cl, and the B$_x$Cl$_y$ protective film is formed on the surface of HfO$_2$, to thereby suppress the progress of the etching reaction. An outline of the reaction is indicated by formula (6).

$$2BCl_3 + 3O \rightarrow B_2O_3 + 6Cl \quad (6)$$

Note that in case of the plasma etching, as shown in FIG. 3B, when the oxygen concentration is set at 0%, the B$_x$Cl$_y$ protective film is formed on the surface to be etched, and the progress of the etching reaction is inhibited. In contrast, in the case of thermal etching, as shown in FIG. 3A, even if the oxygen concentration is set at 0%, there is no extreme drop in the etching rate. This is because in case of the thermal etching, a decomposition reaction as shown in formula (7) is slowly progressed even when the oxygen concentration is set at 0%, thus BCl and Cl can be obtained without forming $B_xCl_y$.

$$BCl_3 \rightarrow BCl + 2Cl \quad (7)$$

As shown in FIG. 4A and FIG. 4B, in case of the thermal etching, it is found that the etching rate is increased by raising the surface temperature of the sample 308. As one of the factors, it can be so considered that the reaction of the aforementioned formulas (5) and (7) is progressed by increasing the surface temperature of the sample 308, thus making it easy to obtain the effects of BCl and Cl.

(Regarding the Chamber Pressure)

In case of the thermal etching, as shown in FIG. 5A, it is found that the etching rate is increased, as the pressure in the reaction chamber 301 is increased. Namely, it can be so considered that the etching rate is increased by allowing the etching shown in the aforementioned formula (4) to progress, thereby increasing the pressure in the reaction chamber 301, without $B_xCl_y$ polymer forming by BCl released from $BCl_3$, because in the case of thermal etching the energy of the BCl generated from $BCl_3$ is not so large as the energy of the BCl generated from plasma.

In contrast, in case of the plasma etching, as shown in FIG. 5B, when the oxygen concentration is set at 0% and the inside of the pressure chamber is set at low pressure, progress of the etching reaction is inhibited. This is because boron-chlorinate compounds i.e. $B_xCl_y$ are formed as a protective film by deposition or polymerization on the surface to be etched. Therefore, it can be so considered that even if the pressure in the processing chamber is raised, the etching rate becomes saturated, and by further raising the pressure, the etching rate is decreased.

As described above, when etching gas containing $BCl_3$ and $O_2$ is used, the etching mechanism differs considerably between thermal etching and plasma etching, thus largely differentiating the etching characteristics also. Accordingly, it can be said that the thermal etching and the plasma etching leverage different etching mechanism from each other, although they are etching by using the same etching gas.

Examples of the present invention are described below with reference to the drawings.

(1) Construction of the Wafer Processing Apparatus

Figure 7:
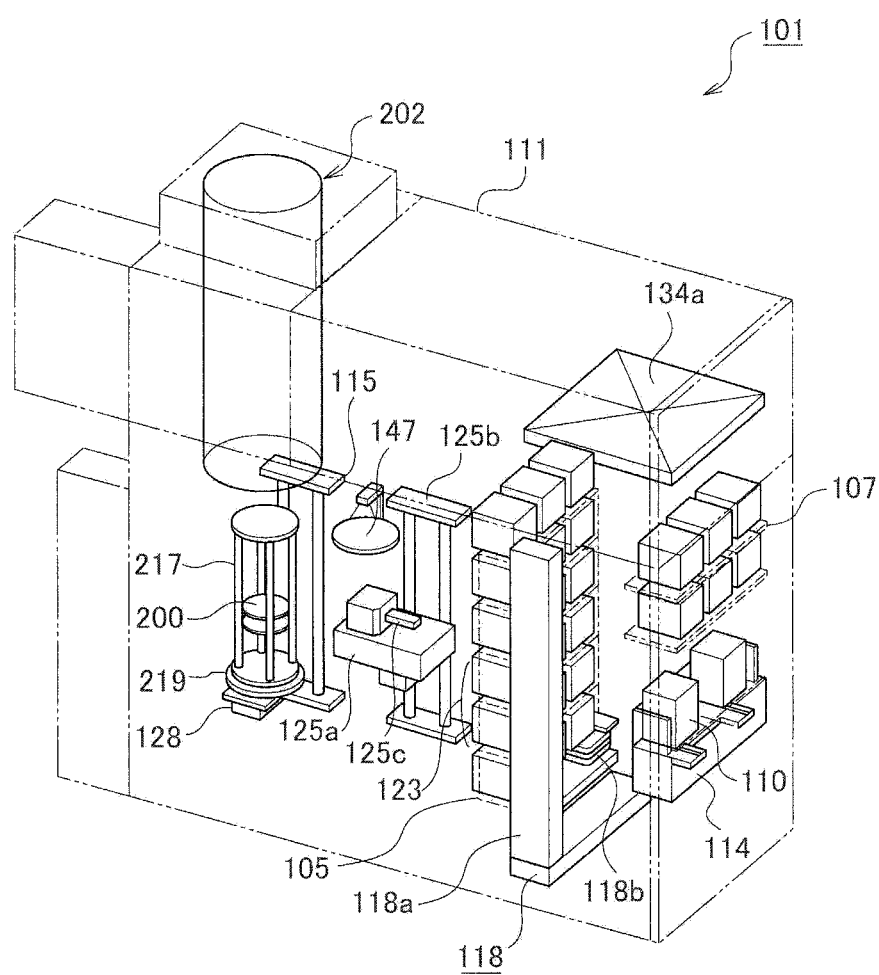
FIG. 7 is an obliquely perspective view according to an embodiment of the present invention.
Figure 8:
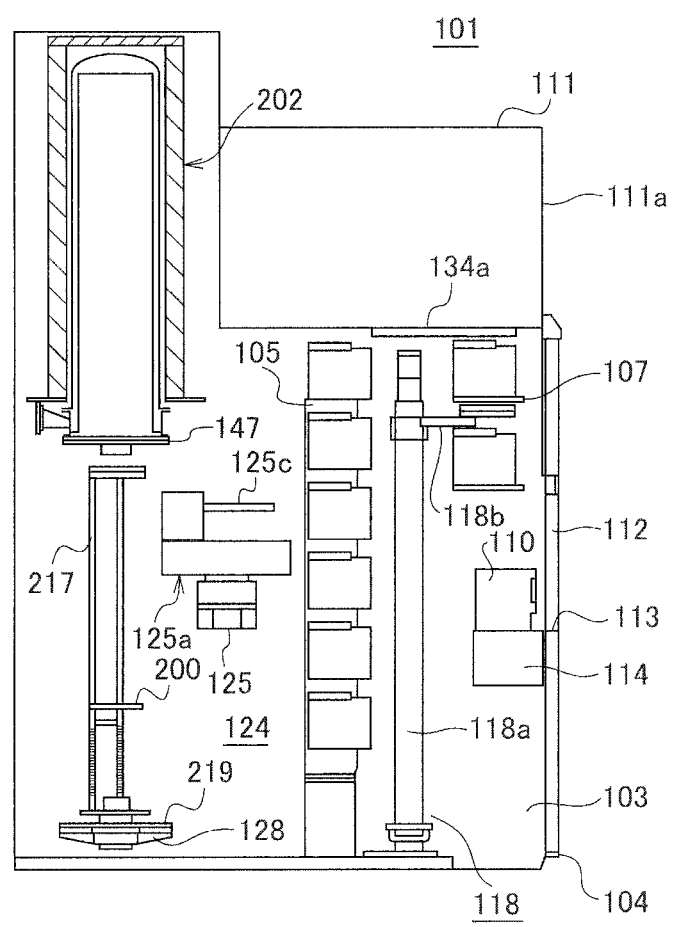
FIG. 8 is a side perspective view according to an embodiment of the present invention.

First, a constitutional example of a wafer processing apparatus 101 for implementing the wafer processing step in the step of manufacturing a semiconductor device will be described with reference to FIG. 7 and FIG. 8. FIG. 7 is an oblique perspective view of a wafer processing apparatus 101 according to an embodiment of the present invention; FIG. 8 is a side perspective view of the wafer processing apparatus 101 according to an embodiment of the present invention.

As shown in FIG. 7 and FIG. 8, the wafer processing apparatus 101 according to this embodiment includes a casing 111. In a lower part of the front face wall 111a of the casing 111, a front maintenance port 103 is provided, as an opening part provided to perform maintenance of the inside of the casing 111. A front maintenance door 104 that opens and closes the front maintenance port 103 is provided on the front maintenance port 103. A cassette 110 as a wafer carrier (substrate storage container) that stores plural wafers 200 is employed for loading wafers 200 made of silicon, etc, into and out of the casing 111. In the front maintenance door 104, a cassette loading and unloading port (loading and unloading port of substrate storage container) 112, being an opening for loading the cassette 110 into/out of the casing 111, is provided so as to communicate the inside and outside of the casing 111. The cassette loading and unloading port 112 is constructed so as to be opened and closed by means of a front shutter (opening/closing mechanism for loading/unloading port of the substrate storage container) 113. A cassette stage (transfer platform for the substrate storage container) 114 is provided inside of the casing 111 of the cassette loading and unloading port 112. The cassette 110 is placed on the cassette stage 114 by an in-process loading device, not shown, and is unloaded to outside of the casing 111 from the cassette stage 114.

The cassette 110 is placed by the in-process loading device on the cassette stage 114 so that the wafer 200 in the cassette 110 set in a vertical posture, and the wafer loading/unloading port of the cassette 110 is directed upward. The cassette stage 114 is constructed so as to rotate the cassette 110 by 90 degrees vertically backward in the casing 111, set the wafer 200 in the cassette 110 in a horizontal posture, and make the wafer loading/unloading port of the cassette 110 directed backward in the casing 111.

Cassette shelves (substrate storage container placement shelves) 105 are installed in a substantially center portion in the longitudinal direction of the casing 111. The cassette shelves 105 are constructed so as to store plural cassettes 110 in multiple stages and in multiple rows. A transfer shelf 123 of a wafer transfer mechanism 125, to be described later, is disposed on these cassette shelves 105, on which a cassette 110, being loaded, is accommodated. In addition, a spare cassette shelf 107 is provided above the cassette stage 114, so as to store the cassette 110 auxiliary.

A cassette transport device (substrate storage container loading device) 118 is provided between the cassette stage 114 and the cassette shelf 105. The cassette transfer device 118 includes a cassette elevator (substrate storage container elevating mechanism) capable of elevating the cassette 110 in a state of holding the cassette 110, and a caste transfer mechanism (substrate storage container transfer mechanism), being a transfer mechanism, that can be move horizontally in a state of holding the cassette 110. By sequential operation of the cassette elevator 118a and the cassette transfer mechanism 118b, the cassette 110 is transferred among the cassette stage 114, the cassette shelf 105, the spare cassette shelf 107, and the transfer shelf 123.

A wafer transfer mechanism (substrate transfer mechanism) 125 is disposed behind the cassette shelf 105. The wafer transfer mechanism 125 is comprised of a wafer transfer device (substrate transfer device) 125a, which is capable of moving a wafer 200 linearly in the horizontal direction without rotation, and a wafer transfer device elevator (substrate transfer device elevating mechanism) 125b, which is capable of moving the wafer transfer device 125a upward/downward. The wafer transfer device 125a includes tweezers (substrate holding bodies) 125c that hold the wafer 200 in a horizontal posture. By sequential operation of these wafer transfer device 125a and wafer transfer device elevator 125b, the wafer 200 is picked up from the inside of the cassette 110 on the transfer shelf 123, and is charged into a boat (substrate holding tool) 217, as described later, and the wafer 200 is discharged from the boat 217 and is stored in the cassette 110 on the transfer shelf 123.

A processing furnace 202 is provided above the rear part of the casing 111. An opening is provided in the bottom part of the processing furnace 202, so as to be opened/closed by a furnace port shutter (furnace port opening/closing mechanism) 147. The construction of the processing furnace 202 is described later.

A boat elevator (substrate holding tool elevation mechanism) 115, being the elevation mechanism for elevating/lowering and loading/unloading the boat 217 into/outside of the processing furnace 202, is provided at the lower part of the processing furnace 202. A linking tool constituted by an arm 128 as a connector is provided on the elevating/lowering table of the boat elevator 115. The boat 217 is vertically supported on the arm 128, and a seal cap 219 is provided in a horizontal posture で,, as a cover that seals the bottom portion of the processing furnace 202 leak free when the boat 217 is elevated by the boat elevator 115.

The boat 217 includes plural holding members, so that plural wafers 200 (for example, 50 to 150 wafers) are held in a horizontal posture, and stacked vertically in multiple stages, with these centers thereof aligned.

A cleaning unit 134a having a blower fan and a particle filter is provided above the cassette shelf 105. The cleaning unit 134a is designed to circulate clean air, being a cleaned fresh air, into the casing 111.

In addition, the cleaning unit (not shown) to supply clean air, having the blower fan and the particle filter, is installed on the left side end portion of the casing 111 on the opposite side of the wafer transfer device elevator 125b and the boat elevator 115. The clean air blown out from the aforementioned cleaning unit, not shown, is circulated through the wafer transfer device 125a and the boat 217, which is then sucked into an exhaust device, not shown, and is exhausted to outside of the casing 111.

(2) Operation of the Wafer Processing Apparatus

Next, the operation of the wafer processing apparatus 101 according to this embodiment of the present invention will be described.

First, before the cassette 110 is placed on the cassette stage 114, the cassette loading/unloading port 112 is opened by means of the front shutter 113. Thereafter, the cassette 110 is loaded from the cassette loading/unloading port 112 by the in-process unloaded device, and is thereby placed on the cassette stage 114, so that the wafer 200 is set in a vertical posture and the wafer loading/unloading port is directed upward. After this, the cassette 110 is rotated by 90° in the vertical direction backward in the casing 111, by means of the cassette stage 114. As a result, the wafer 200 in the cassette 110, is assumably set in a horizontal posture and the wafer loading/unloading port of the cassette 110 is directed backward in the casing 111.

Next, the cassette 110 is automatically loaded and transferred to a designated shelf position of the cassette shelf 105 or the spare cassette shelf 107 by the cassette transport device 118, so as to be temporarily stored therein, before being moved onto the transfer shelf 123 from the cassette shelf 105 or the spare cassette shelf 107, or is directly transported to the transfer shelf 123.

When the cassette 110 is moved on the handling shelf 123, wafers 200 are picked up from the cassette 110 through the wafer loading/unloading port by the tweezers 125c of the wafer transfer device 125a, and are charged into the boat 217 behind the handling chamber 124, by sequential operation of the wafer transfer device 125a and wafer transfer device elevator 125b. After the wafer transfer mechanism 125 has transferred a wafer 200 to the boat 217, the wafer transfer mechanism 125 returns to the cassette 110 and charges the next wafer 200 into the boat 217.

When a pre-determined number of wafers 200 has been charged into the boat 217, the bottom of the processing furnace 202, which had been closed by the furnace port shutter 147, is then opened by the furnace port shutter 147. Subsequently, the boat 217, held with a group of wafers 200 therein, is loaded into the processing furnace 202 by elevating the seal cap 219 by the boat elevator 115. After loading the boat 217, an arbitrary processing is applied to the wafer 200 in the processing furnace 202. Such processing will be described later. After such a processing, the wafer 200 and the cassette 110 are discharged to the outside of the casing 111, in the opposite procedure to the aforementioned procedure.

(3) Framework of the Processing Furnace

Figure 9:
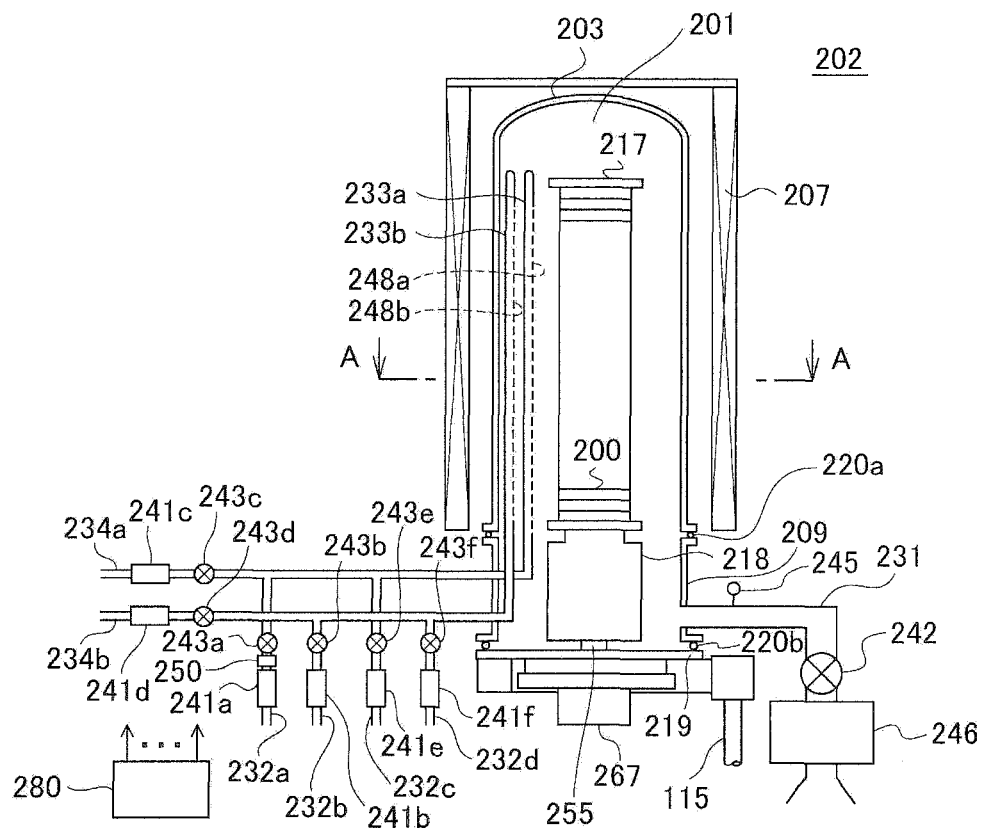
FIG. 9 is a vertical sectional view of a processing furnace according to an embodiment of the present invention.

Next, the framework of the processing furnace 202 having the wafer processing apparatus 101 according to this embodiment will be described with reference to FIG. 9 and FIG. 10. FIG. 9 is a vertical cross-sectional view of the processing furnace 202 having wafer processing apparatus 101 according to this embodiment. FIG. 10 is a cross-sectional view taken along the line A-A of the processing furnace 202 shown in FIG. 9.

As shown in FIG. 9, the processing furnace 202 has a heater 207 as a heating unit (heating mechanism). The heater 207 has a cylindrical shape, and is vertically installed on a heater base (not shown), being a holding board, so as to be supported thereon.

A process tube 203, being a reaction tube, is disposed concentrically inside of the heater 207. The process tube 203 is made of a thermally stable material such as quartz ($SiO_2$) or silicon carbide (SiC) and is formed in cylindrical shape, with its upper end closed and its lower end opened. A processing chamber 201 for applying processing of depositing a high dielectric film on the wafer 200, being the substrate, is formed in a hollow part of the process tube 203. The processing chamber 201 is constituted, so that the wafers 200 can be stored in a horizontal posture on the boat, and stacked vertically in a multilevel manner.

A manifold (throat flange part) 209 is concentrically disposed in the lower part of the process tube 203. The manifold 209 is made of for example stainless and is formed in cylindrical shape with its top end and bottom end opened. The manifold 209 is engaged with the process tube 203 and is arranged so as to support the process tube 203. An O ring 220a is provided between the manifold 209 and process tube 203, as a sealing member. By supporting the manifold 209 on the heater base, the process tube 203 is installed vertically. A reaction container is formed by the process tube 203 and manifold 209.

A film depositing gas supply system (processing gas supply system) and a cleaning gas supply system are respectively connected to the manifold 209. Note that the film depositing gas supply system is a system of supplying the gas for a depositing film (processing gas) to form the high dielectric film as a high dielectric material, and the cleaning gas supply system is a system of supplying the cleaning gas into the processing chamber 201 to remove the deposit including the high dielectric film deposited on the inside of the processing chamber 201. The deposition gas supply system is constructed so as to supply a film deposition material and an oxidant into the processing chamber 201 as film depositing gas. Also, the cleaning gas supply system is constituted so as to supply halide gas and additive gas, being etching gas, into the processing chamber 201 as cleaning gas.

Specifically, in the manifold 209, a first nozzle 233a as a first gas inlet section and a second nozzle 233b as a second gas inlet section are connected respectively so as to communicate with the inside the processing chamber 201. A first gas supply pipe 232a and second gas supply pipe 232b are connected respectively to the first nozzle 233a and the second nozzle 233b. Also, a third gas supply pipe 232c and fourth gas supply pipe 232d are connected respectively to the first gas supply pipe 232a and the second gas supply pipe 232b. In this way, there are provided four gas supply pipes 232a, 232b, 232c, 232d and two nozzles 233a, 233b, as a gas supply path that supplies plural types of gas, in this case, four types of gas, into the processing chamber 201. A deposition gas supply system is constituted by the first gas supply pipe 232a and second gas supply pipe 232b. A cleaning gas supply system is constituted by the third gas supply pipe 232c and fourth gas supply pipe 232d.

In the first gas supply pipe 232a, a first mass flow controller 241a as a flow rate controller (flow rate control unit), a vaporizer 250, and a first valve 243a as the open/close valve, are provided sequentially from the upstream direction. The first mass flow controller 241a is constructed as a liquid mass flow controller that controls the flow rate of liquid raw material, being the deposition raw material, which remains liquid phase at room temperature. Also, a first inert gas supply pipe 234a that supplies inert gas is connected to more downstream side of the first valve 243a of the first gas supply pipe 232a. A third mass flow controller 241c as the flow rate controller (flow rate control unit), and a third valve 243c as the open/close valve are provided sequentially from the upstream direction of the first inert gas supply pipe 234a. In addition, the aforementioned first nozzle 233a is connected to the tip end portion (downstream end portion) of the first gas supply pipe 232a. The first nozzle 233a is provided along the inner wall from the bottom to an upper part of the process tube 203, and along a stacking direction of the wafers 200, in the arcuate space between the inner wall of the process tube 203 and the wafer 200 constituting the processing chamber 201. First gas supply holes 248a, being supply holes for supplying gas, are provided on the side face of the first nozzle 233a. The first gas supply holes 248a, provided all along, have the same opening areas respectively and are furthermore provided at the same opening pitch.

A second mass flow controller 241b as a flow rate control device (flow rate controller), and a second valve 243b as the open/close valve, are provided at the second gas supply pipe 232b sequentially from upstream direction. In addition, a second inert gas supply pipe 234b for supplying inert gas is connected to more downstream side of the second valve 243b of the second gas supply pipe 232b. A fourth mass flow controller 241d as the flow rate control device (flow rate control unit), and a fourth valve 243d as the open/close valve, are provided at this second inert gas supply pipe 234b sequentially from the upstream direction. In addition, the aforementioned second nozzle 233b is connected to the tip end portion (downstream end portion) of the second gas supply pipe 232b. The second nozzle 233b is provided along the inner wall of the process tube 203 from the bottom to the upper part of the process tube 203, and along the stacking direction of the wafers 200, in the arcuate space between the inner wall of the process tube 203 and the wafer 200 constituting the processing chamber 201. Second gas supply holes 248b, being the supply holes for supplying gas, are provided on the side face of the second nozzle 233b. The second gas supply holes 248b, provided all along, have the same opening areas respectively and are provided at the same opening pitch. The aforementioned third gas supply pipe 232c is connected to the more downstream side of a connection part between the first gas supply pipe 232a and the first inert gas supply pipe 234a. A fifth mass flow controller 241e as the flow rate control device (flow rate control unit) and a fifth valve 243e as the open/close valve, are provided at the third gas supply pipe 232c sequentially from the upstream direction.

The aforementioned fourth gas supply pipe 232d is connected to the more downstream side of the connection part between the second gas supply pipe 232b and the second inert gas supply pipe 234b. A sixth mass flow controller 241f as the flow rate controller (flow rate control unit) and a sixth valve 243f as the open/close valve are provided at the fourth gas supply pipe 232d sequentially from the upper stream direction.

From the first gas supply pipe 232a, for example, hafnium source gas obtained by vaporizing TEMAH ($Hf[(C_2H_5)(CH_3)N]_4$, tetrakis-ethylmethylamino-hafnium), being a organic hafnium material, is supplied into the processing chamber 201 through the first mass flow controller 241a, the vaporizer 250, the first valve 243a, and the first nozzle 233a, as a film forming material for deposit a high dielectric film composed of a high dielectric material.

Also, from the second gas supply pipe 232b, oxidizing agent, for example, ozone gas ($O_3$) is supplied into the processing chamber 201 through the second mass flow controller 241b, second valve 243b and second nozzle 233b.

Also, from the third gas supply pipe 232c, boron trichloride ($BCl_3$) gas, being a halide gas, is supplied into the processing chamber 201 through the fifth mass flow controller 241e, the fifth valve 243e, the first gas supply pipe 232a, and the first nozzle 233a, as the cleaning gas (etching gas).

Also, from the fourth gas supply pipe 232d, for example, oxygen gas ($O_2$), being an additive agent of the halide gas is supplied into the processing chamber 201, through the sixth mass flow controller 241f, the sixth valve 243f, the second gas supply pipe 232b, and the second nozzle 233b.

It should be noted that, when these gases are supplied into the processing chamber 201, inert gas may be simultaneously supplied into the first gas supply pipe 232a through the third mass flow controller 241c and third valve 243c, from the first inert gas supply pipe 234a, and from the second inert gas supply pipe 234b, inert gas may be supplied into the second gas supply pipe 232b through the fourth mass flow controller 241d and fourth valve 243d. Dilution of the aforementioned each gas and purging of unused piping may be performed by supply of this inert gas.

In the manifold 209, there is provided an exhaust pipe 231 that exhausts air in the processing chamber 201. A vacuum pump 246 as a vacuum exhaust device is connected to the downstream side of the exhaust pipe 231, namely to the opposite side of the side connected to the manifold 209, through a pressure sensor 245 as a pressure detector and an APC (Auto Pressure Controller) valve 242 as a pressure adjuster. Therefore, the exhaust pipe 231 is designed to exhaust the inside of the processing chamber 201, so that the pressure inside of the processing chamber 201 (chamber pressure) reaches a prescribed value. Note that the APC valve 242 is the control valve designed to keep the pressure of the inside of the processing chamber 201 by opening and closing the valve constant by adjusting a valve opening degree.

As described above, a seal cap 219 is provided below the manifold 209, as a cover that seals leak free a bottom opening of the manifold 209. The seal cap 219 is arranged so as to be abutted on the bottom of the manifold 209 from beneath in the vertical direction. The seal cap 219 is formed in disc shape, made for example of a metal such as stainless steel. An O-ring 220b as a sealing member that abuts on the bottom of the manifold 209 is provided on the top surface of the seal cap 219. A rotating mechanism 267 that rotates the boat 217 is provided on the opposite side of the seal cap 219 on the basis of the processing chamber 201. A rotary shaft 255 penetrates the seal cap 219 and is connected to the boat 217. By operating (rotating) the rotation mechanism 267, the boat 217 and the wafer 200 are rotated. The seal cap 219 is enabled to move up and down by the boat elevator 115, being the elevation mechanism installed vertically outside of the process tube 203. By moving the boat elevator 115 up and down, the boat 217 can be loaded/unloaded into/from the processing chamber 201.

The boat 217 is made of thermally stable materials such as quartz or silicon carbide, and as described above, is constituted to hold plural wafers 200 in a horizontal posture arranged in multiple stages, with centers aligned with one another. Note that a heat insulating member 218 made of thermally stable materials such as quartz or silicon carbide is provided at a lower part of the boat 217, so that heat from the heater 207 is hardly transmitted to the side of the seal cap 219. Note that the heat insulating member 218 may be constituted of plural heat insulating boards made of thermally stable such as quartz or silicon carbide, and a heat insulating board holder for supporting them in a horizontal posture in multiple stages.

As shown in FIG. 10, a temperature sensor 263, being a temperature detector, is provided at the process tube 203. The prescribed temperature distribution within the processing chamber 201 can be achieved by adjusting the power current to the heater 207 based on the temperature information detected by this temperature sensor 263.

Also, the processing furnace 202 according to this embodiment includes a controller 280 constituting a control part (control unit). The controller 280 is connected to for example the first to sixth mass flow controllers 241a, 241b, 241c, 241d, 241e, and 241f, first to sixth valves 243a, 243b, 243c, 243d, 243e, and 243f, the vaporizer 250, the APC valve 242, the heater 207, the vacuum pump 246, the rotating mechanism 267 and the boat elevator 115. The controller 280 is constructed so as to perform for example flow rate adjustment of the first to sixth mass flow controllers 241a, 241b, 241c, 241d, 241e, and 241f, open/close operation of the first to sixth valves 243a, 243b, 243c, 243d, 243e, and 243f, vaporization operation of the vaporizer 250, opening/closing and pressure adjustment operation of the APC valve 242, temperature adjustment of the heater 207, ON/OFF of the vacuum pump 246, adjustment of operation speed of the rotating mechanism 267, and adjustment of for example elevation/lowering operation of the boat elevator 115.

(4) Method of Depositing High Dielectric Constant Film and Cleaning Method

Next, a method of depositing a high dielectric constant film made of high dielectric constant material on a wafer 200 in the processing chamber 201, as a step in the manufacturing steps of a semiconductor device using the processing furnace 202 of the wafer processing apparatus 101 described above, and a method of cleaning the inside of the processing chamber 201 will be described. An example of a deposition method will be described in which a hafnium oxide film ($HfO_2$, hafnia) is deposited as a high dielectric constant film on a wafer 200 by the ALD (Atomic Layer Deposition) method, using TEMAH, which is a hafnium organic material, as the deposition source material and using ozone gas ($O_3$) as oxidizing agent. Also, an example of a cleaning method will be described in which cleaning of the inside of the processing chamber 201 is performed by a thermo-chemical reaction using $BCl_3$ gas and $O_2$ gas as the cleaning gas. It should be noted that, in the following description, the operation of the various sections constituting the wafer processing apparatus 101 is controlled by means of the controller 280.

First, a method of depositing a high dielectric constant film made of high dielectric constant material on a wafer 200 in the processing chamber 201 will be described.

The ALD (Atomic Layer Deposition) method is a kind of deposition technique especially for a thinner film by supplying each of reactive gases alternatively constituting at least two types of source material onto a substrate under suitably prepared deposition conditions (substrate temperature and time etc) and depositing a monolayer sequentially based on the chemical-adsorption reaction onto the underlayer. At this time, the film thickness is controlled by the number of cycles of supplying the reactive gas. For example, detailed explanation therefore will be given hereunder.

After plural wafers 200 are charged into the boat 217 (wafer charging), as shown in FIG. 9, the boat 217 holding the plurality of wafers 200 is lifted by the boat elevator 115 and is loaded into the processing chamber 201 (boat loading). In this sequence, the seal cap 219 is sealed the bottom of the manifold 209 by means of the O-ring 220b.

The inside of the processing chamber 201 is evacuated by means of the vacuum pump 246, so as to reach a desired chamber pressure. Here as elsewhere, at this time, the pressure in the processing chamber 201 is measured by means of the pressure sensor 245 and feedback control of the APC valve 242 is performed in accordance with this measured pressure. Also, the inside of the processing chamber 201 is heated by means of the heater 207 so that it becomes a desired temperature. Feedback control of the current passed to the heater 207 is performed based on temperature data detected by the temperature sensor 263, so that a desired temperature distribution within the processing chamber 201 is achieved. Next, the wafers 200 are rotated by rotating the boat 217 by means of the rotating mechanism 267. After this, the four steps described below are successively executed. Note that the variation without the rotation of the boat 217, namely, the wafer 200 is also possible.

(Step 1)

The first valve 243a of the first gas supply pipe 232a and the third valve 243c of the first inert gas supply pipe 234a are opened, and TEMAH as a source material is fed to the first gas supply pipe 232a, and inert gas ($N_2$) as a carrier gas is fed to the first inert gas supply pipe 234a. The inert gas flows from the first inert gas supply pipe 234a and its flow rate is adjusted by the third mass flow controller 241c. The TEMAH is fed from the first gas supply pipe 232a, with its flow rate adjusted in a liquid state by the first mass flow controller 241a, being a liquid mass flow controller, and is vaporized by the vaporizer 250, which is then mixed with the inert gas, with its flow rate adjusted, and is supplied into the processing chamber 201 from the first gas supply hole 248a of the first nozzle 233a, while being exhausted from the exhaust pipe 231. At this time, the pressure in the processing chamber 201 is maintained in a range from 13.3 to 1330 Pa, for example at 300 Pa, by properly adjusting the APC valve 242. The rate of supply of TEMAH, which is controlled by the first mass flow controller 241a, which is a liquid mass flow controller, is set maintained in a range from 0.01 to 0.1 g/min, and for example, set at 0.05 g/min. The period for which the wafers 200 are exposed to TEMAH is maintained in a range from 30 to 180 seconds, and for example set at 60 seconds. At this time, the temperature of the heater is set, so that the temperature of the wafer 200 is set in a range from 180 to 250° C., and for example, set at 250° C. By supplying the TEMAH into the processing chamber 201, surface reaction occurs between the TEMAH and a surface portion of an underground film on the wafer 200, and the TEMAH is chemically adsorbed thereon.

(Step 2)

Supply of TEMAH is stopped by closing the first valve 243a of the first gas supply pipe 232a. At this point, the APC valve 242 of the exhaust pipe 231 is left open and the inside of the processing chamber 201 is exhausted by the vacuum pump 246, until the pressure inside reaches 20 Pa or less, and the residual TEMAH gas is discharged from the inside of the processing chamber 201. At this time, when the inert gas such as $N_2$ is supplied into the processing chamber 201, the efficiency of removing the residual TEMAH gas is further enhanced.

(Step 3)

The second valve 243b of the second gas supply pipe 232b and the fourth valve 243d of the second inert gas supply pipe 234b are opened, and $O_3$ as an oxidizing agent is fed to the second inert gas supply pipe 232b, and the inert gas ($N_2$) as a carrier gas is fed to the second inert gas supply pipe 234b. The inert gas is fed from the second inert gas supply pipe 234b and its flow rate is adjusted by the fourth mass flow controller 241d. $O_3$ is fed from the second gas supply pipe 232b, with its flow rate adjusted by the second mass flow controller 241b, then is mixed with the inert gas, whose flow rate has been adjusted, and is supplied into the processing chamber 201 from the second gas supply hole 248b while being exhausted from the exhaust pipe 231. At this time, the APC valve 242 is suitably adjusted and the pressure in the processing chamber 201 is maintained in a range from 13.3 to 1330 Pa, for example maintained at 70 Pa. The supply rate of $O_3$ controlled by the second mass flow controller 241b is set in a range from 0.1 to 10 slm, and for example set at 0.5 slm. Note that the time required for exposing the wafer 200 to $O_3$ is set in a range from 1 to 300 seconds, and for example set at 40 seconds. The temperature of the heater 207 is set for example at 250° C., so that the temperature of the wafer at this time is set in a range from 180 to 250° C., similarly to the time of supplying the TEMAH gas of step 1. By supplying $O_3$, $HfO_2$ film is deposited on the wafers 200 by a surface reaction of $O_3$ and the TEMAH which is chemically adsorbed on the surface of the wafers 200.

(Step 4)

Immediately after deposition step is finished, the second valve 243b of the second gas supply pipe 232b is closed, and the supply of $O_3$ is stopped. At this time, the APC valve 242 of the exhaust pipe 231 is left open and the inside of the processing chamber 201 is exhausted by the vacuum pump 246 until the pressure reaches 20 pa or less, and the residual $O_3$ is discharged from the inside of the processing chamber 201. At this time, when the inert gas such as $N_2$ is supplied into the processing chamber 201, the efficiency of discharging the residual $O_3$ is further enhanced.

The aforementioned steps 1 to 4 are set as one cycle, and by repeating this cycle plural times, the $HfO_2$ film of a prescribed thickness can be deposited on the wafers 200.

After the $HfO_2$ film of a prescribed thickness is deposited, the inside of the processing chamber 201 is evacuated and then is then purged by supplying and exhausting the inert gas such as $N_2$. After purging the inside of the processing chamber 201, the gas inside of the processing chamber 201 is replaced with the inert gas such as $N_2$ and the pressure in the processing chamber 201 is restored to atmospheric pressure.

Thereafter, the seal cap 219 is lowered by the boat elevator 115, thereby opening the bottom of the manifold 209, and the processed wafer 200 is unloaded to the outside of the process tube 203 from the bottom of the manifold 209, being held by the boat 217. Thereafter, the processed wafer 200 is discharged from the boat 217.

Next, a method of cleaning the inside of the processing chamber 201 will be described.

When the above deposition process is repeated, thick film is deposited on for example the inner wall of the process tube 203. Hereof, at the time point when the thickness of the film deposited on this inner wall reaches a prescribed thickness, cleaning inside of the process tube 203 is performed. This cleaning is performed as follows.

First, an empty boat 217, namely the boat 217 having no wafer 200 charged therein is lifted by the boat elevator 115, and is loaded into the processing chamber 201 (boat loading). In this sequence, the seal cap 219 is the sealed bottom of the manifold 209 by means of the O-ring 220b.

Subsequently, the inside of the processing chamber 201 is exhausted by the vacuum pump 246 so that the pressure reaches a prescribed value. At this time, the pressure inside of the processing chamber is measured by the pressure sensor 245, and feedback-control of the APC valve 242 is performed based on the measured pressure data. Also, the inside of the processing chamber 201 is heated by the heater 207 so that it reaches a desired temperature. Here as elsewhere, feedback control of the current passed to the heater 207 is performed based on the temperature data detected by the temperature sensor 263, so that a desired temperature distribution is achieved within the processing chamber 201. Next, the boat 217 is rotated by the rotating mechanism 254. Note that the variation without the rotation of the boat 217 is also possible.

Subsequently, the fifth valve 243e of the third gas supply pipe 232c is opened, and the cleaning gas, namely, $BCl_3$, being the halide gas, is fed as an etching gas. The $BCl_3$ is fed from the third gas supply pipe 232c, with its flow rate adjusted by the fifth mass flow controller 241e, then is passed through the first gas supply pipe 232a, and is supplied into the processing chamber 201 from the first gas supply hole 248a of the first nozzle 233a.

The etching gas may be used in a concentration diluted with inert gas such as $N_2$ from 100% to about 20%. If the third valve 243c of the first inert gas supply pipe 234a is also open, the etching gas is enabled to use in a diluted form with inert gas such as $N_2$ in a concentration from 100% to about 20%. The inert gas flows from the first inert gas supply pipe 234a, and its flow rate is adjusted by the third mass flow controller 241c. The $BCl_3$ flows from the third gas supply pipe 232c, and its flow rate is adjusted by the fifth mass flow controller 241e, and is mixed with the inert gas, whose flow rate has been adjusted, in the first gas supply pipe 232a and is supplied into the processing chamber 201 from the first gas supply holes 248a of the first nozzle 233a.

Also, in order to add $O_2$, being the oxidizing agent, to $BCl_3$, being the halide gas as the etching gas, the sixth valve 243f of the fourth gas supply pipe 232d is also set in an open state. $O_2$ flows from the fourth gas supply pipe 232d, with its flow rate adjusted by the sixth mass flow controller 241f, passes through the second gas supply pipe 232b, and is supplied into the processing chamber 201 from the second gas supply holes 248b of the second nozzle 233b. The $O_2$ is mixed in the processing chamber 201 with $BCl_3$ or inert gas.

During this process, supply of $BCl_3$ and/or $O_2$ into the processing chamber 201 and exhaust from the exhaust pipe 231 are intermittently performed. Specifically, cleaning is performed by cyclic etching as explained in FIG. 1B. Specifically, the following steps C1 to C4 is set as one cycle, and by repeating this cycle a prescribed number of times, the cleaning is performed.

(Step C1)

Evacuation of the processing chamber 201 is performed according to the opening level of the APC valve 242. When the pressure inside of the processing chamber 201 reaches the first value, the APC valve 242 is closed. The exhaust system is thereby halted.

(Step C2)

In this state, namely in a state that the pressure in the processing chamber 201 reaches a first value by closing the APC valve 242, the fifth valve 243e and sixth valve 243f are opened and $BCl_3$ and $O_2$ are supplied for a constant time into the processing chamber 201. At this point, the etching gas may be diluted by opening the third valve 243c and supplying inert gas such as $N_2$ into the processing chamber of 201. When the pressure in the processing chamber 201 reaches a second value, the fifth valve 243e and sixth valve 243f are closed and supply of $BCl_3$ and $O_2$ into the processing chamber 201 is stopped. If at this point inert gas such as $N_2$ is supplied, the third valve 243c is also closed and supply of inert gas into the processing chamber 201 is thereby also stopped. The supply system is thereby halted. At this point, all of the valves i.e. the first to sixth valves 243a, 243b, 243c, 243d, 243e, 243f, and the APC valve 242 are set in a closed state. That is, the gas supply system and evacuation system are both set in a sealed state. Inside the processing chamber 201 is thereby sealed, and the $BCl_3$ and $O_2$ are encapsulated in the processing chamber 201.

(Step C3)

This state, i.e. a state in which the processing chamber 201 is sealed and $BCl_3$ and $O_2$ are encapsulated into the processing chamber 201 by stopping the gas supply system and exhaust system, is maintained for a prescribed time.

(Step C4)

After the prescribed time is passed, the APC valve 242 is opened and the inside of the processing chamber 201 is exhausted through the exhaust pipe 231. Thereafter, the third valve 243c or the fourth valve 243d is opened, then the inside of the processing chamber 201 is exhausted from the exhaust pipe 231 while supplying the inert gas such as $N_2$ into the processing chamber 201, and a gas purge of the inside of the processing chamber 201 is performed.

The aforementioned steps C1 to C4 is set as one cycle, and cleaning process by cycle etching is performed by repeating this cycle a prescribed number of times. In this way, when cleaning, the step of closing the APC valve 242 for a fixed time and the step of opening the APC valve 242 for a fixed time are repeated a prescribed number of times. In other words, open/close of the APC valve 242 is repeated intermittently a prescribed number of times. According to the cleaning by cyclic etching, by confirming an etching amount per one cycle, the amount of etching can be controlled by the number of cycles. In addition, the amount of gas consumption can be reduced compared with a system in which cleaning is performed by continuously flowing the etching gas.

The $BCl_3$ or $O_2$ that is introduced into the processing chamber 201 is dispersed in an entire body of the processing chamber 201 and comes into contact with deposits including a high dielectric constant film deposited in the processing chamber 201, namely, on the inner wall of the process tube 203 or on the boat. At this time, a thermo-chemical reaction occurs between the deposits and the $BCl_3$ and/or $O_2$, and a reaction product is thereby generated. The reaction product thus generated is exhausted to the outside of the processing chamber 201 from the exhaust pipe 231. In this way, the deposit is removed (etched), and the cleaning of the inside of the processing chamber 201 is performed.

When the above cycle has been performed a predetermined number of times, the inside of the processing chamber 201 is evacuated and then is exhausted while supplying the inert gas such as $N_2$ into the processing chamber 201, thus purging the inside of the processing chamber 201. After purging the inside of the processing chamber 201, the air in the processing chamber 201 is replaced with the inert gas such as $N_2$.

Processing conditions of the aforementioned cleaning by cycle etching are as follows:

Processing temperature: 300 to 600° C., preferably 400 to 450° C.;

First pressure value: 1.33 to 13300 Pa;

Second pressure value: 13.3 to 66500 Pa, preferably 13300 to 26600 Pa;

Supply of rate Supply rate of $BCl_3$: 0.1 to 10 slm;

Supply of rate Supply rate of $O_2$: 0.1 to 10 slm;

Oxygen concentration ($O_2/(BCl_3+O_2)$): less than 7%, preferably 3% or more and 5% or less and more preferably 4% or less;

Gas supply time (transient time): 0.1 to 15 min;

Gas encapsulating time (encapsulating time): 0.1 to 15 min;

Exhaust time: 0.1 to 10 min; and

Number of cycles: 1 to 100 cycles.

The cleaning process is performed by maintaining a specific value of each cleaning condition within each range.

When the cleaning of the inside of the processing chamber 201 is completed, as described above, the deposition of the high dielectric constant film is performed again on the wafer 200. Specifically, a boat 217 charged with plural Wafers 200 is loaded into the processing chamber 201 and the steps 1 to 4 are repeated to deposit the high dielectric constant film on the wafers 200, the boat 217 charged with the processed wafers 200 is then unloaded from the processing chamber 201. Note that the deposition of the high dielectric constant film is repeated, and when the thickness of the film deposited on the inner wall, etc, of the process tube 203 reaches a prescribed thickness, the aforementioned cleaning is performed again.

(5) Advantage of These Examples

According to these examples, one or more advantages given hereunder are exhibited.

In the cleaning method according to these examples, the cleaning of the inside of the process tube 203 is performed at the point when the thickness of the film deposited on the inner wall, etc, of the process tube 203 reaches a prescribed thickness, and then the deposit including the $HfO_2$ film deposited on the inside of the processing chamber 201 is removed. As a result, it is possible to prevent such a case that during depositing the film, the deposit on the inside of the processing chamber 201 is peeled off and is fallen on the processing substrate if the worst situation happens and included into the $HfO_2$ film.

Further, in the cleaning method according to these examples, the cleaning gas is activated only by heat without using plasma, thereby proceeds etching the deposit on the inside of the processing chamber 201. Namely, a plasma generating source for activating the cleaning gas is not required to be prepared additionally in the processing apparatus, thus making it possible to reduce a manufacturing cost of the processing apparatus and a manufacturing cost of the semiconductor device.

In addition, in the cleaning method according to these examples, when the cleaning by thermal etching is performed, the conditions such as the oxygen concentration, the processing temperature, and the pressure are set in the aforementioned range. The etching rate for the $HfO_2$ can be increased, and the deposit including the $HfO_2$ film on the inside of the processing chamber 201 can be removed at a high rate. In addition, in the cleaning method according to these examples, the etching is performed by maintaining a state of encapsulating the cleaning gas in the processing chamber 201 for a prescribed time. Namely, after the cleaning gas is supplied into the processing chamber 201, the gas supply system and the exhaust system are halted, and supply and exhaust of the cleaning gas are temporarily stopped. As a result, a use amount of the cleaning gas can be reduced.

Also, in the cleaning method according to this embodiment, etching is performed by intermittently supplying/exhausting the cleaning gas. Namely, the steps C1 to C4 are set as one cycle, and the cleaning is performed by repeating this cycle plural number of times. Therefore, by previously confirming the etching amount per one cycle, a total etching amount can be accurately controlled based on the number of cycles.

In addition, in the cleaning method according to these examples, the encapsulating time of the cleaning gas is set in the aforementioned range. As a result, the etching rate for every cycle can be stabilized, thus making it possible to more accurately control the total etching amount based on the number of cycles.

In addition, in the cleaning method of these examples, the processing temperature is set in the aforementioned range. Therefore, as described above, by increasing the processing temperature in the thermal etching using the cleaning gas, the selectivity of the etching rate (etching rate of the $HfO_2$ film/etching rate of the quartz glass) can be increased. That is, damage to the process tube 203 constituting the processing chamber 201 can be reduced.

<Other Example of the Invention>

In the aforementioned examples, explanation is given for the case of depositing the $HfO_y$ (hafnium oxide) film as the high dielectric constant film. However, the present invention is not limited thereto. In addition to this example, the present invention can also be applied to a case of depositing $ZrO_y$ (zirconium oxide) film, $Al_xO_y$ (aluminum oxide) film, $HfSi_xO_y$ (hafnium silicate) film, $HfAl_xO_y$ (hafnium aluminate) film, $ZrSi_xO_y$ (zirconium silicate) film and $ZrAl_xO_y$ (zirconium aluminate film) film (where x and y are integers or decimals larger than 0).

Also, in the above examples, explanation was given for the case of forming the high dielectric constant film by the ALD method. However, the present invention is not limited thereto. For example, the present invention can also be applied to a case of depositing the high dielectric constant film by the CVD (Chemical Vapor Deposition) method, and particularly by the MOCVD (Metal Organic Chemical Vapor Deposition) method.

Also, in the aforementioned examples, explanation was given for the case of using $BCl_3$ as the halide gas. However, as the halide gas, in addition to $BCl_3$, gases such as HCl, $Cl_2$, $SiCl_4$, HBr, $BBr_3$, $SiBr_4$ or $Br_2$ may be used. Also, as the halide gas, it is preferable to select one or more gases from a group consisting of $BCl_3$, HCl, $Cl_2$, $SiCl_4$, HBr, $BBr_3$, $SiBr_4$ and $Br_2$, from a viewpoint that they have a property of easily converting the high dielectric constant oxide material into a highly volatile compound. Among such gases, $BCl_3$ is more preferable from the viewpoint that it has a reducing property of or a property of withdrawing oxygen. By using the halide gas, debris or deposits the deposit or an adhesion matter formed of the aforementioned high dielectric constant oxide material can be converted into halogenated compounds (such as $HfCl_4$, $HfBr_4$, $AlCl_3$, $AlBr_3$, $ZrCl_4$, $ZrBr_4$, $SiCl_4$, $SiBr_4$) and these halogenated compounds are highly volatile compounds, and therefore they can be easily removed from the inside of the chamber (processing chamber).

In the aforementioned example, explanation was given for a case of using $O_2$ as an additive agent. However, other than $O_2$, oxygen based gases such as $O_3$, $H_2O$, $H_2O_2$, $CO_x$, $SO_x$, $N_xO$ or $NO_x$ (x is an integer of 1 or more) may be used as the additive agent. Also, one or more gases selected from the group consisting of $O_2$, $O_3$, $H_2O$, $H_2O_2$, $CO_x$, $SO_x$, $N_xO$ or $NO_x$ (where x is an integer of one or more) is preferable as the oxygen based gas. Among these gases, $O_2$ is more preferable in the point that it can easily generate oxygen.

<Preferred Aspects of the Present Invention>

Preferred aspects of the present invention are described below.

According to one aspect of the present invention, there is provided a method of manufacturing a semiconductor device comprising the steps of:

loading a substrate into a processing chamber;

performing processing to deposit a high dielectric constant film on the substrate by supplying processing gas into said processing chamber;

unloading the processed substrate from said processing chamber; and cleaning an inside of said processing chamber by supplying halide gas and oxygen based gas into said processing chamber, and removing deposits including said high dielectric constant film deposited on said processing chamber;

concentration of said oxygen based gas in said halide gas and said oxygen based gas being set to be less than 7% in the step of cleaning the inside of the processing chamber.

Preferably, in the step of cleaning the inside the processing chamber, the concentration of the oxygen based gas in the halide gas and the oxygen based gas is set at 3% or more and 5% or less. Further preferably, in the step of cleaning the inside of the processing chamber, the concentration of the oxygen based gas in the halide gas and the oxygen based gas is set at 4% or less.

Also preferably, in the step of cleaning the inside of the processing chamber, the step of supplying and encapsulating the halide gas and the oxygen-based gas in the processing chamber, and the step of exhausting the inside of the processing chamber are set as one cycle, and this cycle is repeated plural times.

Also, preferably, in the step of cleaning the inside of the processing chamber, the step of exhausting the inside of the processing chamber and setting the pressure inside of the processing chamber at a first value, and the step of supplying the halide gas and the oxygen-based gas into the processing chamber whose pressure is already set at the first value, so as to set the pressure of the processing chamber at a second value, and in this state, sealing the inside of the processing chamber, thereby encapsulating the halide gas and the oxygen-based gas in the processing chamber, are set as one cycle, and this cycle is repeated plural times.

Also, preferably, in the step of cleaning the inside of the processing chamber, the temperature inside of the processing chamber is set at 400° C. or more and 600° C. or less, and the pressure inside of the processing chamber is set at 13300 Pa or more and 66500 Pa or less.

Also, preferably, in the step of cleaning the inside of the processing chamber, the temperature inside of the processing chamber is set at 400 to 450° C. and the pressure inside of the processing chamber is set at 13300 to 26600 Pa.

Also, preferably, the halide gas is a gas containing boron (B) and a halogen element. More preferably, the halide gas is a gas containing boron (B) and chlorine (Cl). Further preferably, the halide gas is one or more gases selected from the group consisting of $BCl_3$, HCl, $Cl_2$, $SiCl_4$, HBr, $BBr_3$, $SiBr_4$ and $Br_2$. Further preferably, the halide gas is $BCl_3$.

Also, preferably, the oxygen based gas is $O_2$. More preferably, the oxygen based gas is one or more gases selected from the group consisting of $O_2$, $O_3$, $H_2O$, $H_2O_2$, $CO_x$, $SO_x$, $N_xO$ and $NO_x$ (where x is an integer of 1 or more). Further preferably, the combination of the halide gas and the oxygen based gas is $BCl_3$ and $O_2$.

Also, preferably, the high dielectric constant film is a film containing at least any one of the elements: hafnium (Hf), zirconium (Zr) or aluminum (Al). Further preferably, the high dielectric constant film is an oxide film containing at least any one of the elements: hafnium (Hf), zirconium (Zr) or aluminum (Al).

According to another aspect of the present invention, there is provided a processing apparatus comprising: a processing chamber in which processing to deposit a high dielectric constant film on a substrate is performed;

a processing gas supply system that supplies into said processing chamber processing gas for depositing the high dielectric constant film;

a cleaning gas supply system that supplies into said processing chamber halide gas and oxygen based gas for cleaning the inside of the processing chamber by removing deposits including the high dielectric constant film deposited on the inside of the processing chamber; and a controller that controls the cleaning gas supply system, so that the concentration of the oxygen based gas in the halide gas and the oxygen based gas is set to be less than 7% when the inside of the processing chamber is cleaned.

What is claimed is:

1. A method of manufacturing a semiconductor device comprising:

loading a substrate into a processing chamber;

performing processing to deposit a high dielectric constant film on the substrate by supplying processing gas into the processing chamber;

unloading the processed substrate from the processing chamber; and cleaning an inside of the processing chamber by supplying halide gas and oxygen based gas into the processing chamber, and causing a reaction between the halide gas and the oxygen based gas, and removing deposits including the high dielectric constant film deposited on the inside of the processing chamber by thermal etching without using plasma, wherein a temperature in the processing chamber is set to 400° C. or more and 600° C. or less, and a pressure in the processing chamber is set to 13.3 Pa or more and 66500 Pa or less, and a concentration of the oxygen based gas in the halide gas and the oxygen based gas is set to be 5% or less, to thereby suppress generating reaction restrain species, which restrains a progress of the thermal etching, by a reaction between the halide gas and the oxygen based gas, and accelerate the progress of the thermal etching, in the cleaning of the inside of the processing chamber.

2. A method of manufacturing a semiconductor device comprising:

loading a substrate into a processing chamber;

performing processing to deposit a high dielectric constant film on the substrate by supplying processing gas into the processing chamber;

unloading the processed substrate from the processing chamber; and cleaning an inside of the processing chamber by supplying halide gas and oxygen based gas into the processing chamber, and causing a reaction between the halide gas and the oxygen based gas, and removing deposits including the high dielectric constant film deposited on the inside of the processing chamber by thermal etching without using plasma;

wherein a temperature in the processing chamber is set to 400° C. or more and 600° C. or less, and a pressure in the processing chamber is set to 13.3 Pa or more and 66500 Pa or less, and a concentration of the oxygen based gas in the halide gas and the oxygen based gas is set to be 3% or more and 5% or less, to thereby suppress generating reaction restrain species, which restrains a progress of the thermal etching, by a reaction between the halide gas and the oxygen based gas, and accelerate the progress of the thermal etching, in the cleaning of the inside of the processing chamber.

3. The method of claim 1, wherein in the step of cleaning the inside of the processing chamber, the concentration of the oxygen based gas in the halide gas and the oxygen based gas is set to be 4% or less.

4. The method of claim 1, wherein in the step of cleaning the inside of the processing chamber, the step of supplying and encapsulating the halide gas and the oxygen based gas into the processing chamber without exhausting the inside of the processing chamber, and a step of exhausting the inside of the processing chamber are set as one cycle, and this cycle is repeated plural number of times.

5. The method of claim 1, wherein the halide gas is one or more gases selected from a group consisting of $BCl_3$, HCl, $Cl_2$, $SiCl_4$, HBr, $BBr_3$, $SiBr_4$ and $Br_2$.

6. The method of claim 1, wherein the oxygen based gas is one or more gases selected from a group consisting of $O_2$, $O_3$, $H_2O$, $H_2O_2$, $SO_x$, $N_xO$ and $NO_x$ (where x is an integer of 1 or more).

7. A substrate processing apparatus comprising:

a processing chamber in which processing to deposit a high dielectric constant film on a substrate is performed;

a heater that heats the substrate in the processing chamber;

a pressure adjuster that adjusts a pressure in the processing chamber;

a processing gas supply system that supplies into the processing chamber processing gas for depositing the high dielectric constant film;

a cleaning gas supply system that supplies into the processing chamber halide gas and oxygen based gas for cleaning an inside of the processing chamber by causing a reaction between the halide gas and the oxygen based gas and removing deposits including the high dielectric constant film deposited on the inside of the processing chamber by thermal etching without using plasma; and a controller configured to control the heater, the pressure adjuster, and the cleaning gas supply system, so that a temperature in the processing chamber is set to 400° C. or more and 600° C. or less, and a pressure in the processing chamber is set to 13.3 Pa or more and 66500 Pa or less, and a concentration of the oxygen based gas in the halide gas and the oxygen based gas is set to be 5% or less, to thereby suppress generating reaction restrain species, which restrains a progress of the thermal etching, by a reaction between the halide gas and the oxygen based gas, and accelerate the progress of the thermal etching, when the inside of the processing chamber is cleaned.

8. The method of claim 2, wherein the halide gas is one or more gases selected from a group consisting of $BCl_3$, HCl, $Cl_2$, $SiCl_4$, HBr, $BBr_3$, $SiBr_4$ and $Br_2$.

9. The method of claim 3, wherein the halide gas is one or more gases selected from a group consisting of $BCl_3$, HCl, $Cl_2$, $SiCl_4$, HBr, $BBr_3$, $SiBr_4$ and $Br_2$.

10. The method of claim 4, wherein the halide gas is one or more gases selected from a group consisting of $BCl_3$, HCl, $Cl_2$, $SiCl_4$, HBr, $BBr_3$, $SiBr_4$ and $Br_2$.

11. The method of claim 2, wherein the oxygen based gas is one or more gases selected from a group consisting of $O_2$, $O_3$, $H_2O$, $H_2O_2$, $SO_x$, $N_xO$ and $NO_x$ (where x is an integer of 1 or more).

12. A method of cleaning a processing chamber, comprising:

providing a processing chamber in which processing to deposit a high dielectric constant film on a substrate is performed; and cleaning an inside of the processing chamber by supplying halide gas and oxygen based gas into the processing chamber and causing a reaction between the halide gas and the oxygen based gas, and removing deposits including the high dielectric constant film deposited on the inside of the processing chamber by thermal etching without using plasma, wherein a temperature in the processing chamber is set to 400° C. or more and 600° C. or less, and a pressure in the processing chamber is set to 13.3 Pa or more and 66500 Pa or less, and a concentration of the oxygen based gas in the halide gas and the oxygen based gas is set to be 5% or less, to thereby suppress generating reaction restrain species, which restrains a progress of the thermal etching, by a reaction between the halide gas and the oxygen based gas, and accelerate the progress of the thermal etching, in the cleaning of the inside of the processing chamber.

13. The method of claim 12, wherein in the step of cleaning the inside of the processing chamber, a step of supplying and encapsulating the halide gas and the oxygen based gas into the processing chamber without exhausting the inside of the processing chamber, and a step of exhausting the inside of the processing chamber are set as one cycle, and this cycle is repeated plural number of times.

14. The method of claim 12, wherein the halide gas is one or more gases selected from a group consisting of $BCl_3$, HCl, $Cl_2$, $SiCl_4$, HBr, $BBr_3$, $SiBr_4$ and $Br_2$.

15. The method of claim 12, wherein the oxygen based gas is one or more gases selected from a group consisting of $O_2$, $O_3$, $H_2O$, $H_2O_2$, $SO_x$, $N_xO$ and $NO_x$ (where x is an integer of 1 or more).

* * * * *